US011133175B2

(12) United States Patent
Hanawa et al.

(10) Patent No.: US 11,133,175 B2
(45) Date of Patent: Sep. 28, 2021

(54) SUBSTRATE TREATING METHOD AND SUBSTRATE TREATING APPARATUS

(71) Applicant: SCREEN Holdings Co., Ltd., Kyoto (JP)

(72) Inventors: Yosuke Hanawa, Kyoto (JP); Dai Ueda, Kyoto (JP); Yuta Sasaki, Kyoto (JP)

(73) Assignee: SCREEN Holdings Co., Ltd.

( * ) Notice: Subject to any disclaimer, the term of this patent is extended or adjusted under 35 U.S.C. 154(b) by 128 days.

(21) Appl. No.: 16/475,146

(22) PCT Filed: Nov. 10, 2017

(86) PCT No.: PCT/JP2017/040563
§ 371 (c)(1),
(2) Date: Jul. 1, 2019

(87) PCT Pub. No.: WO2018/128008
PCT Pub. Date: Jul. 12, 2018

(65) Prior Publication Data
US 2019/0333755 A1 Oct. 31, 2019

(30) Foreign Application Priority Data
Jan. 6, 2017 (JP) .............................. JP2017-000867

(51) Int. Cl.
*H01L 21/02* (2006.01)
*B08B 3/08* (2006.01)
(Continued)

(52) U.S. Cl.
CPC .......... *H01L 21/02057* (2013.01); *B08B 3/08* (2013.01); *B08B 7/0014* (2013.01); *B08B 7/0057* (2013.01); *H01L 21/6704* (2013.01)

(58) Field of Classification Search
None
See application file for complete search history.

(56) References Cited

U.S. PATENT DOCUMENTS

2014/0239449 A1* 8/2014 Dirnecker ............... H01L 28/20
257/536
2015/0155159 A1 6/2015 Igarashi et al.
(Continued)

FOREIGN PATENT DOCUMENTS

JP 2012-243869 A 12/2012
JP 2013-016699 A 1/2013
(Continued)

OTHER PUBLICATIONS

Machine Translation of WO2016-185888 by Kang-Go Chung et al., published Nov. 24, 2016.*
(Continued)

*Primary Examiner* — Mikhail Kornakov
*Assistant Examiner* — Ryan L Coleman
(74) *Attorney, Agent, or Firm* — Ostrolenk Faber LLP

(57) ABSTRACT

A substrate treating method and a substrate treating apparatus which can reduce the collapse of a pattern on a substrate. The substrate treating method includes a supply step of supplying a process liquid including a sublimable substance in a molten state to a pattern-formed surface of a substrate; a solidification step of solidifying the process liquid on the pattern-formed surface so as to form a solidified body; a sublimation step of subliming the solidified body so as to remove the solidified body from the pattern-formed surface; and an organic substance removal step of removing, when the solidified body is sublimed, an organic substance precipitated on a sublimation interface, and the organic substance removal step is performed so as to overlap at least part of the sublimation step.

5 Claims, 9 Drawing Sheets

(51) Int. Cl.
*B08B 7/00* (2006.01)
*H01L 21/67* (2006.01)

(56) References Cited

U.S. PATENT DOCUMENTS

| | | |
|---|---|---|
| 2017/0162377 A1 | 6/2017 | Igarashi et al. |
| 2018/0068863 A1 | 3/2018 | Fujita et al. |

FOREIGN PATENT DOCUMENTS

| | | |
|---|---|---|
| JP | 2013-258272 A | 12/2013 |
| JP | 2015-050414 A | 3/2015 |
| JP | 2015-106645 A | 6/2015 |
| JP | 2015-142069 A | 8/2015 |
| JP | 2017-139279 A | 8/2017 |
| WO | WO 2016/185888 A1 | 11/2016 |

OTHER PUBLICATIONS

International Search Report dated Jan. 30, 2018 in corresponding PCT International Application No. PCT/JP2017/040563.
Written Opinion dated Jan. 30, 2018 in corresponding PCT International Application No. PCT/JP2017/040563.

\* cited by examiner (a)

(b)

SUBSTRATE TREATING METHOD AND SUBSTRATE TREATING APPARATUS

CROSS-REFERENCE TO RELATED APPLICATIONS

The present application is a 35 U.S.C. §§ 371 national phase conversion of PCT/JP2017/040563, filed Nov. 10, 2017, which claims priority to Japanese Patent Application No. 2017-000867, filed Jan. 6, 2017, the contents of both of which are incorporated herein by reference. The PCT International Application was published in the Japanese language.

TECHNICAL FIELD

The present invention relates to a substrate treating apparatus and a substrate treating method which remove, from substrates, liquids adhered to various types of substrates (hereinafter simply referred to as "substrates") such as a semiconductor substrate, a glass substrate for a photomask, a glass substrate for a liquid crystal display, a glass substrate for a plasma display, a FED (Field Emission Display) substrate, a substrate for an optical disc, a substrate for a magnetic disc and a substrate for a magneto-optical disc.

BACKGROUND ART

In the manufacturing process of an electronic component such as a semiconductor device or a liquid crystal display device, various types of wet processing using liquids are performed on a substrate, and thereafter dry processing for removing the liquids adhered to the substrate by the wet processing is performed on the substrate.

As the wet processing, washing processing which removes contaminants on the surface of the substrate can be mentioned. For example, on the surface of a substrate in which a fine pattern having recesses and projections is formed by a dry etching step, a reaction byproduct (etching residue) is present. In addition to the etching residue, a metal impurity, an organic contaminant and the like may be adhered to the surface of the substrate, and in order to remove these substances, washing processing such as for supplying a washing liquid to the substrate is performed.

After the washing processing, rinse processing which removes the washing liquid with a rinse liquid and dry processing which dries the rinse liquid are performed. As the rinse processing, rinse processing that supplies a rinse liquid such as deionized water (DIW) to the surface of the substrate to which the washing liquid is adhered so as to remove the washing liquid on the surface of the substrate can be mentioned. Thereafter, the dry processing is performed that removes the rinse liquid so as to dry the substrate.

In recent years, as a finer pattern has been formed on a substrate, the aspect ratio of a convex portion in a pattern having recesses and projections (the ratio between the height and the width of the convex portion in the pattern) has been increased. Hence, there is a problem of a so-called pattern collapse in which at the time of dry processing, surface tension that acts on a boundary surface between a liquid such as a washing liquid or a rinse liquid entering a concave portion in the pattern and a gas in contact with the liquid pulls and collapses the adjacent convex portions in the pattern.

As a dry technology for preventing the pattern collapse caused by surface tension as described above, for example, Japanese Unexamined Patent Application Publication No. 2013-16699 discloses a method in which a solution is brought into contact with a substrate where a structure (pattern) is formed such that the solution is changed into a solid, in which the solid is used as a support member (solidified body) for the pattern and in which the support member is removed by being changed from a solid phase to a gas phase without the intervention of a liquid phase. This patent literature also discloses that as the support member, a sublimable substance is used which is at least any of a methacrylic resin material, a styrene resin material and a fluorocarbon material.

Patent literatures 2 and 3 disclose dry technologies in which the solution of a sublimable substance is supplied on a substrate, in which a solvent in the solution is dried such that the top of the substrate is filled with the sublimable substance in a solid phase and in which thus the sublimable substance is sublimed. According to these patent literatures, it is assumed that, since surface tension does not act on a boundary surface between a solid and a gas in contact with the solid, it is possible to reduce the collapse of a pattern caused by surface tension.

Patent literature 4 discloses a dry technology in which the melt of tertiary butanol (t-butanol) is supplied to a substrate to which a liquid is adhered, in which t-butanol is solidified on the substrate so as to form a solidified body and in which t-butanol is thereafter removed by being sublimed.

PRIOR ART DOCUMENT

Patent Literatures

Patent Literature 1: JP 2013-16699 A
Patent Literature 2: JP 2012-243869 A
Patent Literature 3: JP 2013-258272 A
Patent Literature 4: JP 2015-142069 A

SUMMARY OF INVENTION

Technical Problem

However, disadvantageously, even in the dry technologies disclosed in patent literatures 1 to 4, for example, for a substrate having a pattern which is fine and has a high aspect ratio (that is, the height of a convex pattern is greater than the width of the convex pattern), it is impossible to further prevent the collapse of the pattern.

The present invention is made in view of the foregoing problem, and an object thereof is to provide a substrate treating method and a substrate treating apparatus which can reduce the collapse of a pattern on a substrate.

Solution to Problem

The inventors et al. of the present application have found that when organic substances serving as an impurity are included in a process liquid including a sublimable substance, the collapse of a pattern occurs due to the organic substances. In other words, when the sublimable substance is sublimed in a solidified body of the process liquid including the organic substances, the organic substances are precipitated without being sublimed. Furthermore, it has been found that when the organic substances are brought into an aggregated state by interaction between the precipitated organic substances, gravity acts on the pattern, and thus the collapse of the pattern occurs.

In order to solve the above-mentioned problems, the substrate treating method comprises: a supply step of supplying a process liquid including a sublimable substance to a pattern-formed surface of a substrate; a solidification step of solidifying the process liquid on the pattern-formed surface so as to form a solidified body; a sublimation step of subliming the solidified body so as to remove the solidified body from the pattern-formed surface; and an organic substance removal step of removing, when the solidified body is sublimed, an organic substance precipitated on a sublimation interface of the solidified body, wherein the organic substance removal step is performed so as to overlap at least part of the sublimation step.

In the configuration described above, for example, when a liquid is present on the pattern-formed surface of the substrate, by the principle of freeze drying (or sublimation drying), it is possible to remove the liquid while the collapse of the pattern is being prevented. Specifically, in the supply step described above, the process liquid is supplied to the pattern-formed surface of the substrate, and thus the liquid is replaced by the process liquid. Then, in the solidification step, the process liquid is solidified so as to form the solidified body. Furthermore, in the sublimation step, the solidified body is sublimed, and thus the solidified body is removed from the pattern-formed surface. The sublimation of the solidified body is caused by inclusion of the sublimable substance. The sublimable substance is changed from a solid state into a gas state without the intervention of a liquid state, and thus surface tension is prevented from acting on the pattern formed on the substrate. Consequently, it is possible to prevent the collapse of the pattern formed on the substrate. Here, in the configuration described above, the organic substance removal step for removing the organic substances is performed so as to overlap at least part of the sublimation step. Although the organic substances are precipitated from the sublimation interface when the solidified body is sublimed, when the organic substances are brought into the aggregated state, the gravity of the organic substances acts on the pattern so as to cause the collapse of the pattern. In the organic substance removal step, the organic substances precipitated from the sublimation interface are removed before they are brought into the aggregated state by interaction between the organic substances, and thus it is possible to further reduce the collapse of the pattern.

Here, the "sublimable" described above unit that a single substance, a compound or a mixture has the property of changing its phase from a solid phase to a gas phase or from a gas phase to a solid phase without the intervention of a liquid phase, and the "sublimable substance" unit a substance which has the sublimable property described above. The "pattern-formed surface" described above unit a surface in which a concave-convex pattern is formed in an arbitrary region in the substrate regardless of the surface having a planar shape, a curved shape or a concave-convex shape. The "solidified body" described above means a body obtained by the solidification of the process liquid in a liquid state, and examples thereof can include a liquid which is solidified in a state where the liquid is mixed with the process liquid. The "sublimation interface" described above means a solid-gas interface where the sublimable substance is sublimed in the solidified body and a free front surface (or a region) which is not in contact with an object.

In this configuration, the organic substance removal step may be performed before start of the sublimation step, at a time of the start of the sublimation step or during the sublimation step.

In this configuration, the organic substance removal step may be completed during the sublimation step, at a time of completion of the sublimation step or after the completion of the sublimation step.

In this configuration, the organic substance removal step may be continuously performed.

In this configuration, the sublimation step may be started during the solidification step. In this way, the solidified body which is solidified during the solidification step can be sublimed before the completion of the solidification step, and thus the processing time of the substrate can be reduced. The organic substance removal step is also performed so as to overlap at least part of the sublimation step, and thus the organic substance removal step can also be started during the solidification step. Consequently, the processing time of the substrate can be more reduced.

In this configuration, it is preferred that the organic substance removal step is a step of irradiating ultraviolet rays to the sublimation interface of the solidified body in the sublimation step. Ultraviolet rays are irradiated to the sublimation interface of the sublimable substance in the solidified body, and thus the organic substances which are precipitated without being sublimed on the sublimation interface can be decomposed so as to be removed.

In this configuration, it is preferred that the organic substance removal step is a step of bringing an ozone gas into contact with the sublimation interface of the solidified body in the sublimation step. The ozone gas is brought into contact with the sublimation interface of the sublimable substance in the solidified body, and thus the organic substances which are precipitated without being sublimed on the sublimation interface can be decomposed so as to be removed.

In order to solve the above-mentioned problems, the substrate treating apparatus according to the present invention comprises: a supplying unit of supplying a process liquid including a sublimable substance to a pattern-formed surface of a substrate; a solidifying unit of solidifying the process liquid on the pattern-formed surface so as to form a solidified body; a subliming unit of subliming the solidified body so as to remove the solidified body from the pattern-formed surface; and an organic substance removing unit of removing, when the solidified body is sublimed, an organic substance precipitated on a sublimation interface of the solidified body, wherein the organic substance removing unit removes the organic substance from the solidified body which is being sublimed with the subliming unit.

In the configuration described above, for example, when a liquid is present on the pattern-formed surface of the substrate, by the principle of freeze drying (or sublimation drying), it is possible to remove the liquid while the collapse of the pattern is being prevented. Specifically, the supplying unit supplies the process liquid to the pattern-formed surface of the substrate, and thus the liquid is replaced by the process liquid. Then, the solidifying unit solidifies the process liquid so as to form the solidified body. Furthermore, the subliming unit sublimes the solidified body so as to remove the solidified body from the pattern-formed surface. The sublimation of the solidified body is caused by inclusion of the sublimable substance. The sublimable substance is changed from a solid state into a gas state without the intervention of a liquid state, and thus surface tension is prevented from acting on the pattern formed on the substrate. Consequently, it is possible to prevent the collapse of the pattern formed on the substrate. Here, in the configuration described above, the organic substance removing unit removes the organic substances from at least the solidified body which is being sublimed. Although the organic substances are precipitated from the sublimation interface when the sublimable substance in the solidified body is sublimed, when the organic substances are brought into the aggregated state by interaction between the organic substances, the gravity of the organic substances acts on the pattern so as to cause the collapse of the pattern. The organic substance removing unit removes the organic substances precipitated from the sublimation interface before they are brought into the aggregated state, and thus it is possible to further reduce the collapse of the pattern.

Advantageous Effects of Invention

The present invention has effects described below by use of the units described above.

Specifically, in the present invention, for example, when a liquid is present on the pattern-formed surface of the substrate, the liquid is replaced with the process liquid including the sublimable substance, thereafter the process liquid is solidified so as to form the solidified body and then the solidified body is sublimed. Hence, surface tension is prevented from acting on the pattern formed on the substrate, and thus it is possible to reduce the collapse of the pattern. Moreover, the organic substances which are precipitated from the sublimation interface in the solidified body that is being sublimed are previously removed, and thus when the organic substances are brought into the aggregated state by interaction between the organic substances, gravity is prevented from acting on the pattern, with the result that it is possible to further reduce the occurrence of the collapse of the pattern. In other words, the present invention can provide the substrate treating method and the substrate treating apparatus which can satisfactorily perform the drying processing on the front surface of the substrate while further reducing the collapse of the pattern as compared with the conventional case.

DESCRIPTION OF EMBODIMENTS

First Embodiment

A first embodiment of the present invention will be described below.

Figure 1:
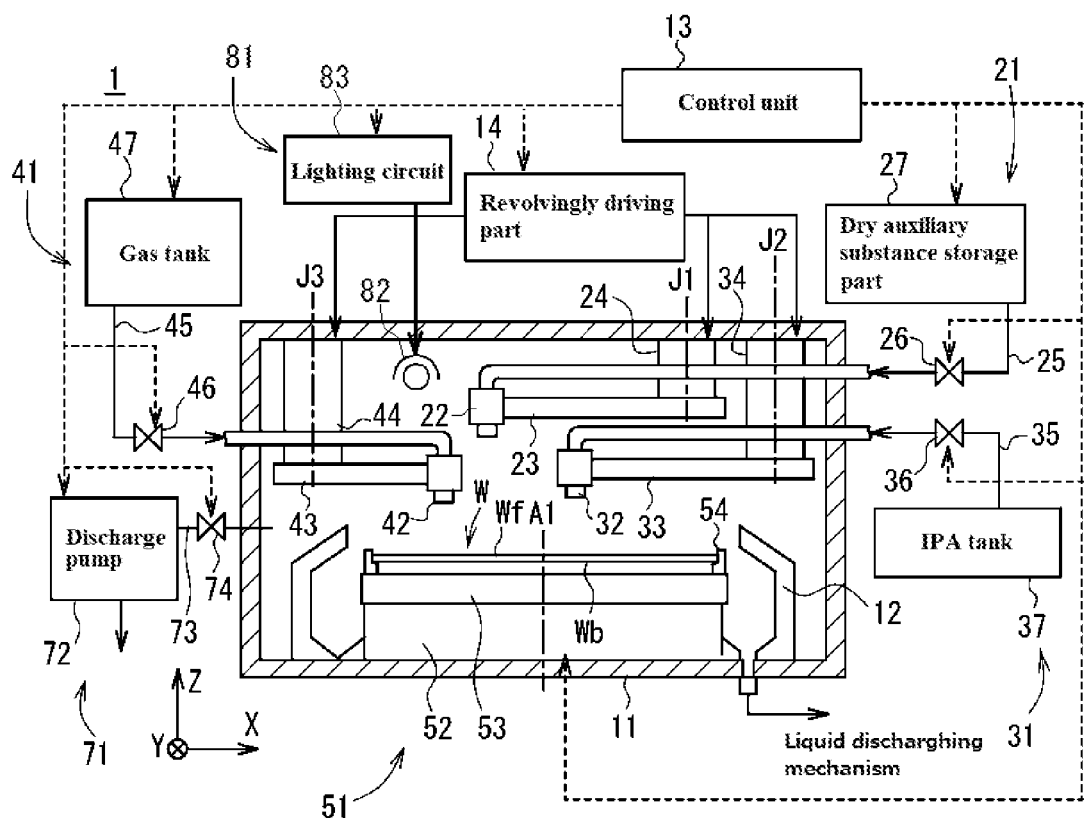
FIG. 1 is an illustrative diagram schematically showing a substrate treating apparatus according to a first embodiment of the present invention.
Figure 2:
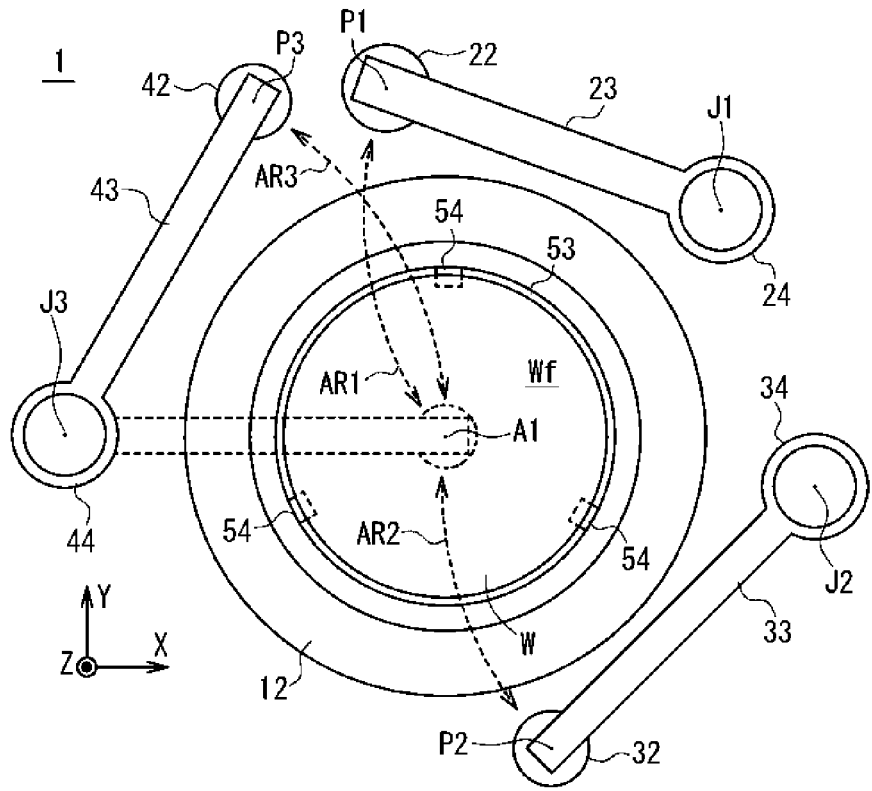
FIG. 2 is a schematic plan view showing the substrate treating apparatus.

FIG. 1 is an illustrative diagram schematically showing the substrate treating apparatus 1 according to the present embodiment. FIG. 2 is a schematic plan view showing the internal configuration of the substrate treating apparatus 1. In individual figures, in order to clarify the relationship of directions shown in the figures, XYZ orthogonal coordinate axes are shown as necessary. In FIGS. 1 and 2, an XY plane indicates a horizontal plane, and a +Z direction indicates a vertically upward direction.

A substrate treating apparatus 1 can be used, for example, for processing on various types of substrates. The "substrates" described above refer to various types of substrates such as a semiconductor substrate, a glass substrate for a photomask, a glass substrate for a liquid crystal display, a glass substrate for a plasma display, a FED (Field Emission Display) substrate, a substrate for an optical disc, a substrate for a magnetic disc and a substrate for a magneto-optical disc. In the present embodiment, a description will be given using, as an example, a case where the substrate treating apparatus 1 is used for processing on a semiconductor substrate (hereinafter referred to as a "substrate W").

As an example of the substrate W, a substrate is used in which a circuit pattern and the like (hereinafter referred to as a "pattern") are formed on only one main surface. Here, a pattern-formed surface (main surface) on which the pattern is formed is referred to as a "front surface", and a main surface on the opposite side on which the pattern is not formed is referred to as a "back surface". The surface of the substrate which is directed downward is referred to as a "lower surface", and the surface of the substrate which is directed upward is referred to as an "upper surface". A description will be given below with the assumption that the upper surface is the front surface.

The substrate treating apparatus 1 is a single-wafer type substrate treating apparatus which is used in washing processing (including rinse processing) for removing contaminants such as particles adhered to the substrate W and dry processing after the washing processing. Although in FIGS. 1 and 2, only parts which are used for the dry processing are shown, and a washing nozzle and the like which are used for the washing processing are not shown, the substrate treating apparatus 1 may include the nozzle and like.

<1-1 Configuration of Substrate Treating Apparatus>

The configuration of the substrate treating apparatus 1 will first be described with reference to FIGS. 1 and 2.

The substrate treating apparatus 1 includes at least a chamber 11 which is a container for storing the substrate W, a substrate holding unit 51 which holds the substrate W, a control unit 13 which controls the individual portions of the substrate treating apparatus 1, a process liquid supplying unit (supplying unit) 21 which supplies a dry auxiliary liquid as a process liquid to the substrate W held in the substrate holding unit 51; an IPA supplying unit 31 which supplies IPA to the substrate W held in the substrate holding unit 51, a gas supplying unit (solidifying unit, subliming unit) 41 which supplies a gas to the substrate W held in the substrate holding unit 51, a scattering prevention cup 12 which collects the IPA, the dry auxiliary liquid and the like which are supplied to the substrate W held in the substrate holding unit 51 and which are discharged to the outside of a circumferential portion of the substrate W, a revolvingly driving part 14 which individually and independently turns and drives arms to be described later in individual portions of the substrate treating apparatus 1, a pressure reducing unit 71 which reduces the pressure within the chamber 11 and an ultraviolet irradiating unit (organic substance removing unit) 81 which irradiates ultraviolet rays. The substrate treating apparatus 1 also includes a substrate carrying-in/out unit, a chuck pin opening/closing mechanism and a wet washing unit (all of which are not illustrated). The individual portions of the substrate treating apparatus 1 will be described later.

The substrate holding unit 51 includes a rotation driving part 52, a spin base 53 and chuck pins 54. The spin base 53 has a plane size which is slightly larger than the substrate W. In the vicinity of a circumferential portion of the spin base 53, a plurality of chuck pins 54 for grasping the circumferential portion of the substrate W are provided so as to stand. Although the number of chuck pins 54 installed is not particularly limited, at least three or more chuck pins 54 are preferably provided in order to reliably hold the circular substrate W. In the present embodiment, along the circumferential portion of the spin base 53, three chuck pins 54 are arranged at regular intervals (see FIG. 2). Each of the chuck pins 54 includes a substrate support pin which supports the circumferential portion of the substrate W from below and a substrate hold pin which presses the outer circumferential end surface of the substrate W supported by the substrate support pin so as to hold the substrate W.

Each of the chuck pins 54 can be switched between a pressed state where the substrate hold pin presses the outer circumferential end surface of the substrate W and a released state where the substrate hold pin is separated from the outer circumferential end surface of the substrate W, and the switching of the states is performed according to an operation instruction from the control unit 13 which controls the entire device.

More specifically, when the substrate W is loaded or unloaded with respect to the spin base 53, the individual chuck pins 54 are brought into the released state whereas when substrate processing to be described later from the washing processing to subliming processing is performed on the substrate W, the individual chuck pins 54 are brought into the pressed state. When the chuck pin 54 is brought into the pressed state, the chuck pin 54 grasps the circumferential portion of the substrate W such that the substrate W is held in a horizontal posture (XY plane) a predetermined distance apart from the spin base 53. In this way, the substrate W is held horizontally in a state where its front surface Wf is directed upward.

Although as described above, in the present embodiment, the substrate W is held by the spin base 53 and the chuck pins 54, a method of holding the substrate is not limited to this method. For example, the back surface Wb of the substrate W may be held by an adsorption method with a spin chuck or the like.

The spin base 53 is coupled to the rotation driving part 52. The rotation driving part 52 is rotated about a axis A1 along the Z direction by an operation instruction from the control unit 13. The rotation driving part 52 is formed with a belt, a motor and a rotation shaft which are known. As the rotation driving part 52 is rotated about the axis A1, the substrate W which is held by the chuck pins 54 above the spin base 53 is also rotated about the axis A1 together with the spin base 53.

The process liquid supplying unit 21 (supplying unit) will then be described.

The process liquid supplying unit 21 is a unit which supplies the dry auxiliary liquid (process liquid) to the pattern-formed surface of the substrate W, and includes, as shown in FIG. 1, at least a nozzle 22, an arm 23, a turning shaft 24, a pipe 25, a valve 26 and a process liquid storing part 27.

Figure 4:
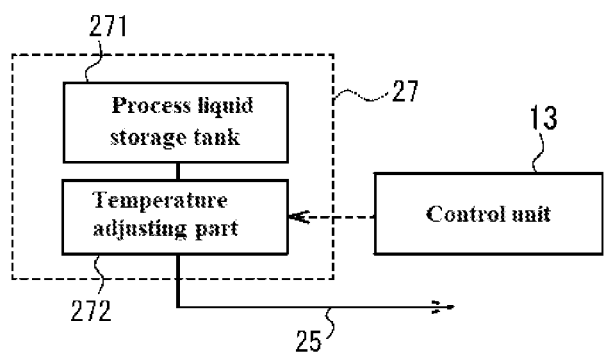
FIG. 4(a) is a block diagram showing a schematic configuration of a dry auxiliary liquid reservoir portion in the substrate treating apparatus.
FIG. 4(b) is an illustrative diagram showing a specific configuration of the dry auxiliary liquid reservoir portion.
Figure 4:
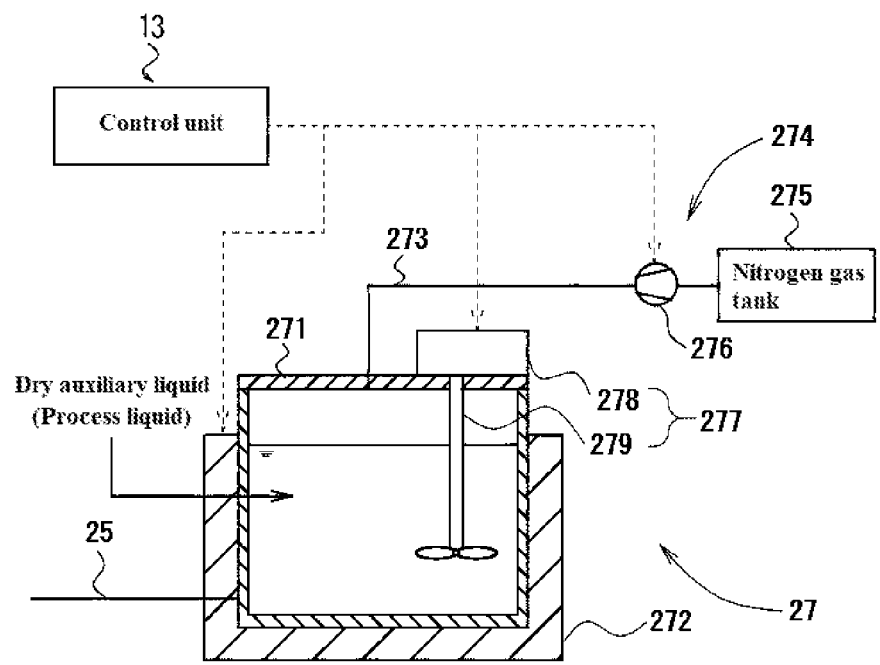

As shown in FIGS. 4(*a*) and 4(*b*), the process liquid storing part 27 includes at least a process liquid storing tank 271, an agitation part 277 which agitates the dry auxiliary liquid within the process liquid storing tank 271, a pressurization part 274 which pressurizes the process liquid storing tank 271 so as to feed out the dry auxiliary liquid and a temperature adjusting part 272 which heats the dry auxiliary liquid within the process liquid storing tank 271. FIG. 4(*a*) is a block diagram showing a schematic configuration of the process liquid storing part 27, and FIG. 4(*b*) is an illustrative diagram showing a specific configuration of the process liquid storing part 27.

The agitation part 277 includes a rotation part 279 which agitates the dry auxiliary liquid within the process liquid storing tank 271 and an agitation control part 278 which controls the rotation of the rotation part 279. The agitation control part 278 is electrically connected to the control unit 13. The rotation part 279 has a propeller-shaped agitation blade at a tip end of the rotation shaft (the lower end of the rotation part 279 in FIG. 5), the control unit 13 provides an operation instruction to the agitation control part 278 such that the rotation part 279 is rotated, and thus the dry auxiliary liquid is agitated by the agitation blade, with the result that the concentration and temperature of a dry auxiliary substance and the like in the dry auxiliary liquid are made uniform.

The method of making uniform the concentration and temperature of the dry auxiliary liquid within the process liquid storing tank 271 is not limited to the method described above, and a known method such as a method of additionally providing a circulation pump to circulate the dry auxiliary liquid can be used.

The pressurization part 274 is formed with a nitrogen gas tank 275 which is the supply source of a gas for pressurizing the interior of the process liquid storing tank 271, a pump 276 which pressurizes nitrogen gas and a pipe 273. The nitrogen gas tank 275 is connected through the pipe 273 with the pipeline to the process liquid storing tank 271, and the pump 276 is interposed in the pipe 273. The pump 276 is electrically connected to the control unit 13. The pump 276 supplies, by an operation instruction of the control unit 13, the nitrogen gas stored in the nitrogen gas tank 275 through the pipe 273 to the process liquid storing tank 271 so as to adjust the pressure within the process liquid storing tank 271. The control of the pump 276 by the control unit 13 is performed based on a detection value of a pressure sensor (unillustrated) which is provided within the process liquid storing tank 271 and which is electrically connected to the control unit 13. In this way, the pressure within the process liquid storing tank 271 can be maintained to be a predetermined pressure which is higher than atmospheric pressure.

The temperature adjusting part 272 is electrically connected to the control unit 13, and heats, by the operation instruction of the control unit 13, the dry auxiliary liquid stored in the process liquid storing tank 271 so as to perform temperature adjustment. The temperature adjustment is preferably performed such that the temperature of the dry auxiliary liquid is equal to or more than the melting point of the dry auxiliary substance (sublimable substance the details of which will be described later) contained in the dry auxiliary liquid. In this way, it is possible to maintain the molten state of the dry auxiliary substance. The upper limit of the temperature adjustment is preferably a temperature which is lower than the boiling point. The temperature adjusting part 272 is not particularly limited, and for example, a known temperature adjustment mechanism can be used such as a resistance heater, a Peltier element or a pipe through which water whose temperature is adjusted is passed. In the present embodiment, the configuration of the temperature adjusting part 272 is arbitrary. For example, when an environment in which the substrate treating apparatus 1 is installed is an environment whose temperature is higher than the melting point of the sublimable substance, since it is possible to maintain the molten state of the sublimable substance, it is not necessary to heat the dry auxiliary liquid. Consequently, the temperature adjusting part 272 can be omitted.

With reference back to FIG. 1, the process liquid storing part 27 (more specifically, the process liquid storing tank 271) is connected through the pipe 25 with the pipeline to the nozzle 22, and the valve 26 is interposed partway through the path of the pipe 25.

The valve 26 is electrically connected to the control unit 13, and is normally closed. The opening and closing of the valve 26 is also controlled by the operation instruction of the control unit 13. When the control unit 13 provides the operation instruction to the process liquid supplying unit 21 so as to open the valve 26, the dry auxiliary liquid is fed by pressure from the interior of the process liquid storing tank 271 which is pressurized, and is discharged through the pipe 25 from the nozzle 22. In this way, it is possible to supply the dry auxiliary liquid to the front surface Wf of the substrate W. Since the process liquid storing tank 271 uses, as described above, the pressure caused by the nitrogen gas to feed the dry auxiliary liquid, the process liquid storing tank 271 is preferably configured so as to be airtight.

The nozzle 22 is attached to the tip end portion of the arm 23 which is provided so as to be extended horizontally, and is arranged above the spin base 53. The back end portion of the arm 23 is supported by the turning shaft 24 provided so as to be extended in the Z direction such that the back end portion of the arm 23 is freely rotated about an axis J1, and the turning shaft 24 is provided so as to be fixed within the chamber 11. The arm 23 is coupled through the turning shaft 24 to the revolvingly driving part 14. The revolvingly driving part 14 is electrically connected to the control unit 13, and turns the arm 23 about the axis J1 by the operation instruction from the control unit 13. As the arm 23 is turned, the nozzle 22 is also moved.

As indicated by solid lines in FIG. 2, the nozzle 22 is normally located outside the circumferential portion of the substrate W, and is arranged in a retraction position P1 outside the scattering prevention cup 12. When the arm 23 is turned by the operation instruction of the control unit 13, the nozzle 22 is moved along the path of an arrow AR1 so as to be arranged in a position above the center portion (the axis A1 or the vicinity thereof) of the front surface Wf of the substrate W.

With reference back to FIG. 1, the IPA supplying unit 31 will be described. The IPA supplying unit 31 is a unit which supplies the IPA (isopropyl alcohol) to the substrate W, and includes a nozzle 32, an arm 33, a turning shaft 34, a pipe 35, a valve 36 and an IPA tank 37.

The IPA tank 37 is connected through the pipe 35 with the pipeline to the nozzle 32, and the valve 36 is interposed partway through the path of the pipe 35. In the IPA tank 37, the IPA is stored, the IPA within the IPA tank 37 is pressurized with an unillustrated pressurization unit and thus the IPA is fed from the pipe 35 in the direction of the nozzle 32. Since the pressurization unit can also be realized by pressurization with a pump or the like or by compressing and storing the gas into the IPA tank 37, any pressurization unit may be used.

The valve 36 is electrically connected to the control unit 13, and is normally closed. The opening and closing of the valve 36 is controlled by the operation instruction of the control unit 13. When the valve 36 is opened by the operation instruction of the control unit 13, the IPA is passed through the pipe 35 and is supplied from the nozzle 32 to the front surface Wf of the substrate W.

The nozzle 32 is attached to the tip end portion of the arm 33 which is provided so as to be extended horizontally, and is arranged above the spin base 53. The back end portion of the arm 33 is supported by the turning shaft 34 provided so as to be extended in the Z direction such that the back end portion of the arm 33 is freely rotated about an axis J2, and the turning shaft 34 is provided so as to be fixed within the chamber 11. The arm 33 is coupled through the turning shaft 34 to the revolvingly driving part 14. The revolvingly driving part 14 is electrically connected to the control unit 13, and turns the arm 33 about the axis J2 by the operation instruction from the control unit 13. As the arm 33 is turned, the nozzle 32 is also moved.

As indicated by solid lines in FIG. 2, the nozzle 32 is normally located outside the peripheral portion of the substrate W, and is arranged in a retraction position P2 outside the scattering prevention cup 12. When the arm 33 is turned by the operation instruction of the control unit 13, the nozzle 32 is moved along the path of an arrow AR2 so as to be arranged in a position above the center portion (the axis A1 or the vicinity thereof) of the front surface Wf of the substrate W.

Although in the present embodiment, IPA is used in the IPA supplying unit 31, as long as a liquid is used which is soluble in the dry auxiliary substance and deionized water (DIW), in the present invention, there is no limitation to IPA. Examples of a replacement of the IPA in the present embodiment include methanol, ethanol, acetone, benzene, carbon tetrachloride, chloroform, hexane, decalin, tetralin, acetic acid, cyclohexanol, ether and hydrofluoroether (Hydro Fluoro Ether).

With reference back to FIG. 1, the gas supplying unit 41 will be described. The gas supplying unit 41 is a unit which supplies a gas to the substrate W, and includes a nozzle 42, an arm 43, a turning shaft 44, a pipe 45, a valve 46 and a gas tank 47. The gas supplying unit 41 is used for solidifying the process liquid supplied to the substrate W so as to form a solidified body or subliming the solidified body (the details of which will be described later).

Figure 5:
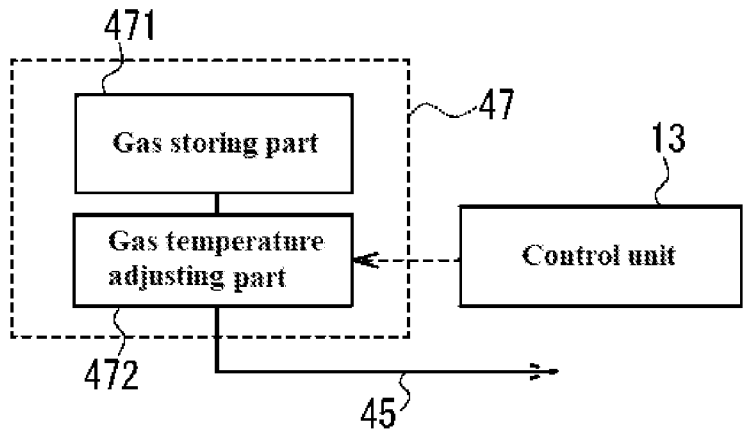
FIG. 5 is a block diagram showing a schematic configuration of a gas tank in the substrate treating apparatus.

FIG. 5 is a block diagram showing a schematic configuration of the gas tank 47. The gas tank 47 includes a gas storing part 471 which stores a gas and a gas temperature adjusting part 472 which adjusts the temperature of the gas stored in the gas storing part 471. The gas temperature adjusting part 472 is electrically connected to the control unit 13, and heats or cools the gas stored in the gas storing part 471 by the operation instruction of the control unit 13 so as to perform temperature adjustment. The temperature adjustment is preferably performed such that the gas stored in the gas storing part 471 has a low temperature which is equal to or less than the freezing point of the dry auxiliary substance. The supply source of the gas may be utility facilities provided within a factory or the like.

The gas temperature adjusting part 472 is not particularly limited, and for example, a known temperature adjustment mechanism can be used such as a Peltier element or a pipe through which water whose temperature is adjusted is passed.

With reference back to FIG. 1, the gas tank 47 (more specifically, the gas storing part 471) is connected through the pipe 45 with the pipeline to the nozzle 42, and the valve 46 is interposed partway through the path of the pipe 45. The gas within the gas tank 47 is pressurized with an unillustrated pressurization unit so as to be fed to the pipe 45. Since the pressurization unit can be realized by pressurization with a pump or the like or by compressing and storing the gas into the gas tank 47, any pressurization unit may be used.

The valve 46 is electrically connected to the control unit 13, and is normally closed. The opening and closing of the valve 46 is controlled by the operation instruction of the control unit 13. When the valve 46 is opened by the operation instruction of the control unit 13, the gas is passed through the pipe 45 and is supplied from the nozzle 42 to the front surface Wf of the substrate W.

The nozzle 42 is attached to the tip end portion of the arm 43 which is provided so as to be extended horizontally, and is arranged above the spin base 53. The back end portion of the arm 43 is supported by the turning shaft 44 provided so as to be extended in the Z direction such that the back end portion of the arm 43 is freely rotated about an axis J3, and the turning shaft 44 is provided so as to be fixed within the chamber 11. The arm 43 is coupled through the turning shaft 44 to the revolvingly driving part 14. The revolvingly driving part 14 is electrically connected to the control unit 13, and turns the arm 43 about the axis J3 by the operation instruction from the control unit 13. As the arm 43 is turned, the nozzle 42 is also moved.

As indicated by solid lines in FIG. 2, the nozzle 42 is normally located outside the peripheral portion of the substrate W, and is arranged in a retraction position P3 outside the scattering prevention cup 12. When the arm 43 is turned by the operation instruction of the control unit 13, the nozzle 42 is moved along the path of an arrow AR3 so as to be arranged in a position above the center portion (the axis A1 or the vicinity thereof) of the front surface Wf of the substrate W. How the nozzle 42 is arranged in the position above the center portion of the front surface Wf is indicated by dotted lines in FIG. 2.

In the gas storing part 471, an inert gas which is inert to at least the dry auxiliary substance, more specifically, nitrogen gas, is stored. The nitrogen gas stored is adjusted in the gas temperature adjusting part 472 such that its temperature is equal to or below the freezing point of the dry auxiliary substance. The temperature of the nitrogen gas is not particularly limited as long as the temperature is equal to or below the freezing point of the dry auxiliary substance, and the temperature of the nitrogen gas can be normally set within a range equal to or more than 0° C. and equal to or less than 15° C. The temperature of the nitrogen gas is set equal to or more than 0° C., and thus it is possible to prevent water vapor present within the chamber 11 from being solidified and adhered to the front surface Wf of the substrate W, with the result that it is possible to prevent the substrate W from being adversely affected.

The nitrogen gas used in the first embodiment is preferably a dry gas whose dew point is equal to or less than 0° C. When the nitrogen gas is sprayed to a solidified body under an atmospheric pressure environment, the dry auxiliary substance in the solidified body is sublimed into the nitrogen gas. Since the nitrogen gas is continuously supplied to the solidified body, the partial pressure of the dry auxiliary substance in a gaseous state produced by the sublimation in the nitrogen gas is kept lower than the saturated vapor pressure of the dry auxiliary substance in the gaseous state at the temperature of the nitrogen gas, and thus at least the surface of the solidified body is filled under an atmosphere in which the dry auxiliary substance in the gaseous state is present at the saturated vapor pressure or less.

Although in the present embodiment, as the gas supplied by the gas supplying unit 41, nitrogen gas is used, as long as the gas is inert to the dry auxiliary substance, there is no limitation to the gas in the practice of the present invention. Examples of a replacement of the nitrogen gas in the first embodiment include argon gas, helium gas and air (a gas having a nitrogen gas concentration of 80% and an oxygen gas concentration of 20%). Alternatively, a mixture gas obtained by mixing a plurality of types of gases described above may be used.

Returning FIG. 1, the pressure reducing unit 71 is a means which reduces the interior of the chamber 11 in pressure to an environment lower than atmospheric pressure, and includes an exhaust pump 72, a pipe 73 and a valve 74. The exhaust pump 72 is a known pump which is connected through the pipe 73 with the pipeline to the chamber 11 and which applies pressure to the gas. The exhaust pump 72 is electrically connected to the control unit 13, and is normally in a stop state. The drive of the exhaust pump 72 is controlled by the operation instruction of the control unit 13. The valve 74 is interposed in the pipe 73. The valve 74 is electrically connected to the control unit 13, and is normally closed. The opening and closing of the valve 74 is controlled by the operation instruction of the control unit 13.

When the exhaust pump 72 is driven by the operation instruction of the control unit 13, and the valve 74 is opened, the gas present within the chamber 11 is exhausted by the exhaust pump 72 through the pipe 73 to the outside of the chamber 11.

The scattering prevention cup 12 is provided so as to surround the spin base 53. The scattering prevention cup 12 is connected to an unillustrated raising/lowering mechanism so as to be able to be raised and lowered in the Z direction. When the dry auxiliary liquid and the IPA are supplied to the substrate W, the scattering prevention cup 12 is located by the raising/lowering mechanism in a predetermined position as shown in FIG. 1 so as to surround, from lateral positions, the substrate W held by the chuck pins 54. In this way, it is possible to collect liquids such as the dry auxiliary liquid and the IPA scattered from the substrate W and the spin base 53.

The ultraviolet irradiating unit 81 will then be described.

The ultraviolet irradiating unit 81 includes at least an ultraviolet lamp 82 and a lighting circuit 83. The ultraviolet lamp 82 is provided in an arbitrary position above the substrate W. In the ultraviolet lamp 82, in order to control, as necessary, the direction of irradiation of ultraviolet rays and the range of irradiation thereof, a light shielding plate having an arbitrary shape or the like may be provided. The lighting circuit 83 is electrically connected to the control unit 13, and turns on and off the ultraviolet lamp 82 by the operation instruction of the control unit 13. When the light shielding plate is provided in the ultraviolet lamp 82, the lighting circuit 83 operates the light shielding plate by the operation instruction of the control unit 13 so as to timely adjust the direction of irradiation of ultraviolet rays irradiated and the range of irradiation thereof.

Figure 3:
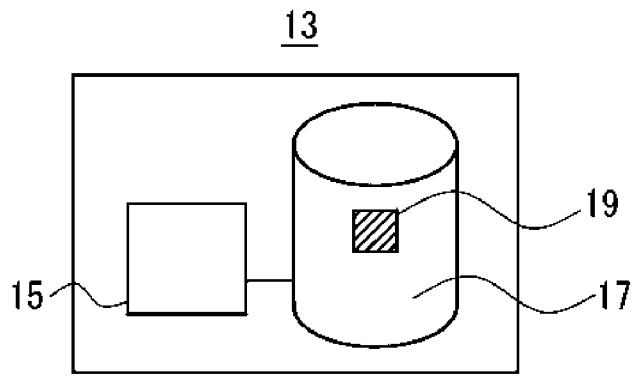
FIG. 3 is an illustrative diagram showing a schematic configuration of a control unit in the substrate treating apparatus.

FIG. 3 is a schematic view showing the configuration of the control unit 13. The control unit 13 is electrically connected to the individual portions of the substrate treating apparatus 1 (see FIG. 1), and controls the operations of the individual portions. The control unit 13 is formed with a computer which includes a computation processing part 15 and a memory 17. As the computation processing part 15, a CPU which performs various types of computation processing is used. The memory 17 includes a ROM which is a read-only memory for storing basic programs, a RAM which is a readable and writable memory for storing various types of information and a magnetic disc for storing control software, data and the like. In the magnetic disc, substrate processing conditions (recipes) corresponding to the substrate W is previously stored. The CPU reads the substrate processing conditions on the RAM so as to control the individual portions of the substrate treating apparatus 1 according to the details thereof.

<1-2 Process Liquid>

Next, the process liquid used in the present embodiment will be described below.

The dry auxiliary liquid of the present embodiment contains the dry auxiliary substance (sublimable substance), and, in dry processing for removing the liquid present on the pattern-formed surface of the substrate, functions as a dry assistant liquid for assisting the dry processing.

The sublimable substance is not particularly limited, and examples thereof include hexamethylenetetramine, 1,3,5-trioxane, ammonium 1-pyrrolidinecarbodithioate, meta-aldehyde, paraffin (CnH2n+2 (n: 20 to 48)), t-butanol, paradichlorobenzene, naphthalene, L-menthol and a fluorocarbon compound.

When as the sublimable substance, hexamethylenetetramine, 1,3,5-trioxane, ammonium 1-pyrrolidine carbodithioate, methaldehyde or paraffin is used, the DIW or the IPA can be used as the solvent of the process liquid.

The fluorinated carbon compound is a compound in which a fluoro group is bound as a substituent to a carbon compound. When the fluorinated carbon compound is used as the sublimable substance, the fluorinated carbon compound is included in the process liquid so as to be in a molten state. Here, the "molten state" means a state where the sublimable substance is molten completely or partially so as to be a liquid having fluidity. Specifically, for example, the fluorinated carbon compound is preferably at least any one of compounds (A) to (E) below. These compounds can be used singly or a plurality thereof can be used together.

Compound (A): a fluoroalkane having 3 to 6 carbon atoms, or the fluoroalkane to which a substituent is bonded;

Compound (B): a fluorocycloalkane having 3 to 6 carbon atoms, or the fluorocycloalkane to which a substituent is bonded;

Compound (C): a fluorobicycloalkane having 10 carbon atoms, or the fluorobicycloalkane to which a substituent is bonded;

Compound (D): a fluorotetracyanoquinodimetane, or the fluorotetracyanoquinodimetane to which a substituent is bonded; and Compound (E): a fluorocyclotriphosphazene, or the fluorocyclotriphosphazene to which a substituent is bonded.

[Compound (A)]

The compound (A) may be a fluoroalkane having 3 to 6 carbon atoms and represented by the general formula (1):

[Chemical Formula 1]

$$C_mH_nF_{2m+2-n} \tag{1}$$

(where m represents an integer equal to or more than 3 and equal to or less than 6, n represents an integer equal to or more than 0 and 2m+2−n≥1 holds true.)

More specific examples of the fluoroalkane having 3 carbon atoms include $CF_3CF_2CF_3$, $CHF_2CF_2CF_3$, $CH_2FCF_2CF_3$, $CH_3CF_2CH_3$, $CHF_2CF_2CH_3$, $CH_2FCF_2CH_3$, $CH_2FCF_2CH_2F$, $CHF_2CF_2CHF_2$, $CF_3CHFCF_3$, $CH_2FCHFCF_3$, $CHF_2CHFCF_3$, $CH_2FCHFCH_2F$, $CHF_2CHFCHF_2$, $CH_3CHFCH_3$, $CH_2FCHFCH_3$, $CHF_2CHFCH_3$, $CF_3CH_2CF_3$, $CH_2FCH_2CF_3$, $CHF_2CH_2CF_3$, $CH_2FCH_2CH_2F$, $CH_2FCH_2CHF_2$, $CHF_2CH_2CHF_2$, $CH_3CH_2CH_2F$, and $CH_3CH_2CHF_2$.

Examples of the fluoroalkane having 4 carbon atoms include $CF_3(CF_2)_2CF_3$, $CF_3(CF_2)_2CH_2F$, $CF_3CF_2CH_2CF_3$, $CHF_2(CF_2)_2CHF_2$, $CHF_2CHFCF_2CHF_2$, $CF_3CH_2CF_2CHF_2$, $CF_3CHFCH_2CF_3$, $CHF_2CHFCHFCHF_2$, $CF_3CH_2CF_2CH_3$, $CF_3CF_2CH_2CH_3$, $CF_3CHFCF_2CH_3$, and $CHF_2CH_2CF_2CH_3$.

Examples of the fluoroalkane having 5 carbon atoms include $CF_3(CF_2)_3CF_3$, $CF_3CF_2CF_2CHFCF_3$, $CHF_2(CF_2)_3CF_3$, $CHF_2(CF_2)_3CHF_2$, $CF_3CH(CF_3)CH_2CF_3$, $CF_3CHFCF_2CH_2CF_3$, $CF_3CF(CF_3)CH_2CHF_2$, $CHF_2CHFCF_2CHFCHF_2$, $CF_3CH_2CF_2CH_2CF_3$, $CHF_2(CF_2)_2CHFCH_3$, $CHF_2CH_2CF_2CH_2CHF_2$, and $CF_3(CH_2)_3CF_3$, $CF_3CHFCHFCF_2CF_3$.

Examples of the fluoroalkane having 6 carbon atoms include $CF_3(CF_2)_4CF_3$, $CF_3(CF_2)_4CHF_2$, $CF_3(CF_2)_4CH_2F$, $CF_3CH(CF_3)CHFCF_2CF_3$, $CHF_2(CF_2)_4CHF_2$, $CF_3CF_2CH_2CH(CF_3)CF_3$, $CF_3CF_2(CH_2)_2CF_2CF_3$, $CF_3CH_2(CF_2)_2CH_2CF_3$, $CF_3(CF_2)_3CH_2CF_3$, $CF_3CH(CF_3)(CH_2)_2CF_3$, $CHF_2CF_2(CH_2)_2CF_2CHF_2$, $CF_3(CF_2)_2(CH_2)_2CH_3$.

The compound (A) may be the fluoroalkane, which has 3 to 6 carbon atoms, to which a substituent is bonded. The substituent may be at least one selected from the group consisting of halogen groups other than a fluoro group (specifically, chloro, bromo and iodo groups), a hydroxyl group, an oxygen atom, alkyl groups, a carboxyl group, and perfluoroalkyl groups.

Examples of the alkyl group include methyl, ethyl, n-propyl, isopropyl, n-butyl, and t-butyl groups.

The perfluoroalkyl group is not particularly limited, and examples thereof include any saturated perfluoroalkyl group, and any unsaturated perfluoroalkyl group. The perfluoroalkyl group may have a linear structure or a branched structure. More specific examples of the perfluoroalkyl group include trifluoromethyl, perfluoroethyl, perfluoro-n-propyl, perfluoroisopropyl, perfluoro-n-butyl, perfluoro-sec-butyl, perfluoro-tert-butyl, perfluoro-n-amyl, perfluoro-sec-amyl, perfluoro-tert-amyl, perfluoroisoamyl, perfluoro-n-hexyl, perfluoroisohexyl, perfluoroneohexyl, perfluoro-n-heptyl, perfluoroisoheptyl, perfluoroneoheptyl, perfluoro-n-octyl, perfluoroisooctyl, perfluoroneooctyl, perfluoro-n-nonyl, perfluoroneononyl, perfluoroisononyl, perfluoro-n-decyl, perfluoroisodecyl, perfluoroneodecyl, perfluoro-sec-decyl, and perfluoro-tert-decyl groups.

[Compound (B)]

The compound (B) may be a fluorocycloalkane having 3 to 6 carbon atoms and represented by the general formula (2):

$$C_mH_nF_{2m-n} \tag{2}$$

wherein m represents an integer of 3 to 6 both inclusive, n represents an integer of 0 or more, and "2m−n"≥1.

More specific examples of the fluorocycloalkane having 3 to 6 carbon atoms include monofluorocyclohexane, dodecafluorocyclohexane, 1,1,4-trifluorocyclohexane, 1,1,2,2-tetrafluorocyclobutane, 1,1,2,2,3-pentafluorocyclobutane, 1,2,2,3,3,4-hexafluorocyclobutane, 1,1,2,2,3,3-hexafluorocyclobutane, 1,1,2,2,3,3-hexafluorocyclobutane, 1,1,2,2,3,4-hexafluorocyclobutane, 1,1,2,2,3,3-hexafluorocyclopentane, 1,1,2,2,3,4-hexafluorolcyclopentane, 1,1,2,2,3,3,4-heptafluorocyclopentane, 1,1,2,2,3,4,5-heptafluorocyclopentane, 1,1,2,2,3,3,4,4-octafluorocyclopentane, 1,1,2,2,3,3,4,5-octafluorocyclopentane, 1,1,2,2,3,3,4,5-octafluorocyclopentane, 1,1,2,2,3,4,5,6-octafluorocyclohexane, 1,1,2,2,3,3,4,4-octafluorocyohexane, 1,1,2,2,3,3,4,4-octafluorocyclohexane, 1,1,2,2,3,3,4,5-octafluorocyclohexane, 1,1,2,2,3,4,4,5,6-nonafluorocyclohexane, 1,1,2,2,3,3,4,4,5-nonafluorocyclohexane, 1,1,2,2,3,3,4,5,6-nonafluorocyclohexane, 1,1,2,2,3,3,4,5,5,6-decafluorocyclohexane, 1,1,2,2,3,3,4,4,5,6-decafluorocyclohexane, 1,1,2,2,3,3,4,4,5,5-decafluorocyclohexane, 1,1,2,2,3,3,4,4,5,6-decafluorocyclohexane, perfluorocyclopropane, perfluorocyclobutane, perfluorocyclopentane, and perfluorocyclohexane.

The compound (B) may be the fluorocycloalkane, which has 3 to 6 carbon atoms, to which a substituent is bonded. The substituent may be at least one selected from the group consisting of halogen groups other than a fluoro group (specifically, chloro, bromo and iodo groups), a hydroxyl group, an oxygen atom, alkyl groups, a carboxyl group, and perfluoroalkyl groups. The alkyl group and the perfluoroalkyl group are not particularly limited. Examples thereof are the same as described about the compound (A).

Specific examples of the compound (B) in which a substituent is bonded to the fluorocycloalkane, which has 3 to 6 carbon atoms, include 1,2,2,3,3-tetrafluoro-1-trifluoromethylcyclobutane, 1,2,4,4-tetrafluoro-1-trifluoromethylcyclobutane, 2,2,3,3-tetrafluoro-1-trifluoromethylcyclobutane, 1,2,2-trifluoro-1-trimethylcyclobutane, 1,4,4,5,5-pentafluoro-1,2,2,3,3-pentamethylcyclopentane, 1,2,5,5-tetrafluoro-1,2-dimethylcyclopentane, 3,3,4,4,5,5,6,6-octafluoro-1,2-dimethylcyclohexane, 1,1,2,2-tetrachloro-3,3,4,4-tetrafluorocyclobutane, 2-fluorocyclohexanol, 4,4-difluorocyclohexanone, 4,4-difluorocyclohexanecarboxylic acid, 1,2,2,3,3,4,4,5,5,6,6-undecafluoro-1-(nonafluorobutyl)cyclohexanone, perfluoromethylcyclopropane, perfluorodimethylcyclopropane, perfluorotrimethylcyclopropane, perfluoromethylcyclobutane, perfluorodimethylcyclobutane, perfluorotrimethylcyclobutane, perfluoromethylcyclopentane, perfluorodimethylcyclopentane, perfluorotrimethylcyclopentane, perfluoromethylcyclohexane, perfluorodimethylcyclohexane, and perfluorotrimethylcyclohexane.
[Compound (C)]

Examples of the fluorobicycloalkane, which has 10 carbon atoms, as the compound (C) include fluorobicyclo[4.4.0]decane, fluorobicyclo[3.3.2]decane, perfluorobicyclo[4.4.0]decane, and perfluorobicyclo[3.3.2]decane.

The compound (C) may be the fluorobicycloalkane, which has 10 carbon atoms, to which a substituent is bonded. The substituent may be a halogen radical other than a fluoro group (specifically, a chloro, bromo or iodo groups), a cycloalkyl group which may have a halogen atom, or an alkyl group having a cycloalkyl group which may have a halogen atom.

In the cycloalkyl group which may have a halogen atom, examples of the halogen atom include fluorine, chlorine, bromine and iodine atoms. Examples of the cycloalkyl group which may have a halogen atom include cyclopropyl, cyclobutyl, cyclopentyl, cyclohexyl, cycloheptyl, perfluorocyclopropyl, perfluorocyclobutyl, perfluorocyclopentyl, perfluorocyclohexyl, and perfluorocycloheptyl groups.

In the alkyl group having a cycloalkyl group which may have a halogen atom, examples of the halogen atom include fluorine, chlorine, bromine and iodine atoms. In the alkyl group having a cycloalkyl group which may have a halogen atom, this cycloalkyl group, which may have a halogen atom, may be, for example, a cyclopropyl, cyclobutyl, cyclopentyl, cyclohexyl, cycloheptyl, perfluorocyclopropyl, perfluorocyclobutyl, perfluorocyclopentyl, perfluorocyclohexyl or perfluorcycloheptyl group. A specific example of the alkyl group having a cycloalkyl group which may have a halogen atom is a difluoro(undecafluorocyclohexyl)methyl group.

A specific example of the compound (C) in which a substituent is bonded to the fluorobicycloalkane, which has 10 carbon atoms, is 2-[difluoro(undecafluorocyclohexyl)methyl]-1,1,2,3,3,4,4,4a,5,5,6,6,7,7,8,8,8a-heptadecafluorodecahydronaphthalene.
[Compound (D)]

An example of the fluorotetracyanoquinodimethane as the compound (D) is tetrafluorocyanoquinodimethane.

The compound (D) may be, for example, a compound in which at least one of halogen groups other than a fluoro group (specifically, chloro, bromo, and iodo groups) is bonded to the fluorotetracyanoquinodimethane.
[Compound (E)]

Examples of the fluorocyclotriphosphazene as the compound (E) include hexafluorocyclotriphosphazene, octafluorocyclotetraphosphazene, decafluorocyclopentaphosphazene, and dodecafluorocyclohexaphosphazene.

The compound (E) may be a compound in which a substituent is bonded to the fluorocyclotriphosphazene. Examples of the substituent include halogen groups other than a fluoro group (specifically, chloro, bromo and iodo groups), and phenoxy and alkoxy (—OR) groups. Examples of R in the alkoxy groups include alky, fluoroalkyl, and aromatic groups. Examples of R include methyl, ethyl and other alkyl groups; trifluoromethyl and other fluoroalkyl groups; and phenyl and other aromatic groups.

Specific examples of the compound (E) in which a substituent as described above is bonded to the fluorocyclotriphosphazene include hexachlorocyclotriphosphazene, octachlorocyclotetraphosphazene, decachlorocyclopentaphosphazene, dodecacyclohexaphosphazene, and hexaphenoxycyclotriphosphazene.

When the sublimable substance is the fluorinated carbon compound, the dry auxiliary liquid may be formed of only the fluorinated carbon compound in a molten state or may further include an organic solvent. In this case, the content of the sublimable substance (fluorinated carbon compound) is preferably equal to or more than 60% by mass with respect to the total mass of the dry auxiliary liquid, and is more preferably equal to or more than 95% by mass. The organic solvent is not particularly limited as long as it is compatible with the sublimable substance in a molten state. Specifically, for example, alcohols are mentioned.

<1-3 Substrate Treating Method>

A substrate treating method using the substrate treating apparatus 1 of the present embodiment will then be described below with reference to FIGS. 6 and 7. A description will be given below using, an example, a case where the fluorinated carbon compound is used as the sublimable substance.

Figure 6:
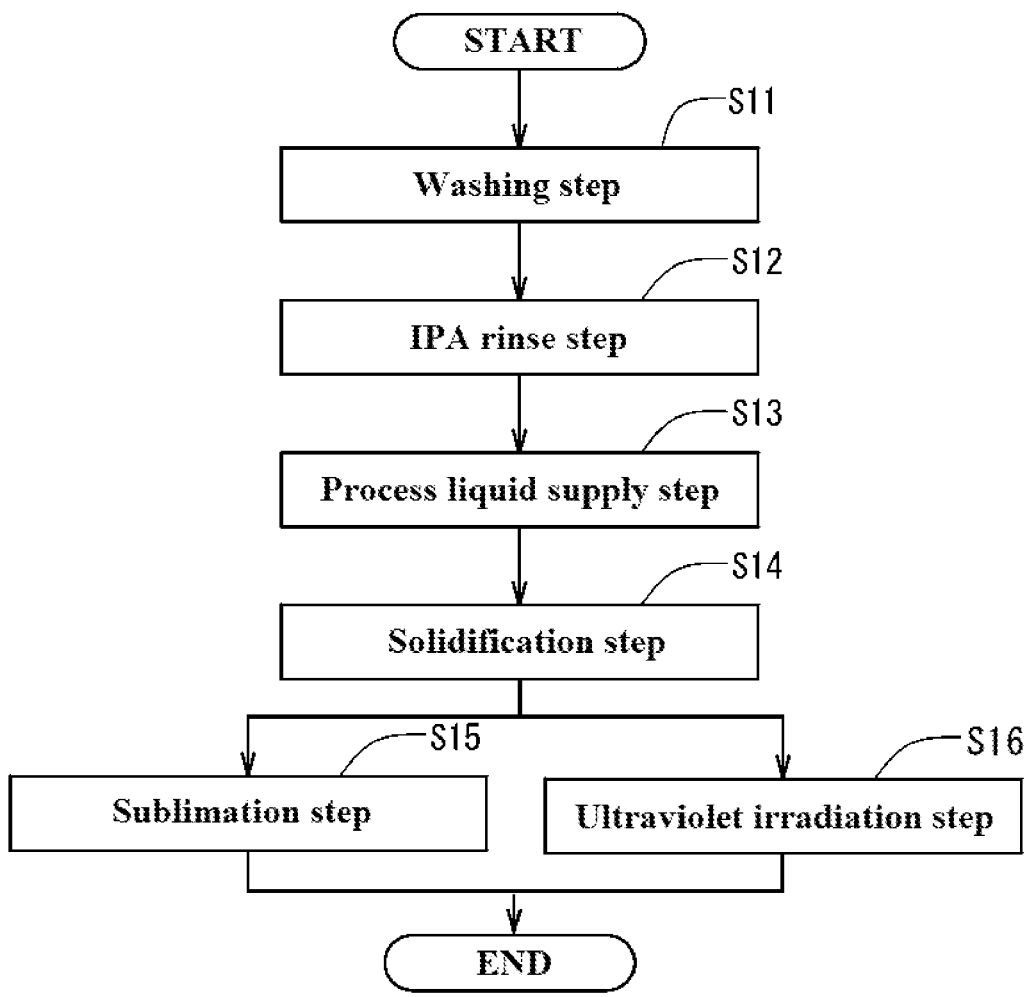
FIG. 6 is a flowchart showing a substrate treating method using the substrate treating apparatus.
Figure 7:
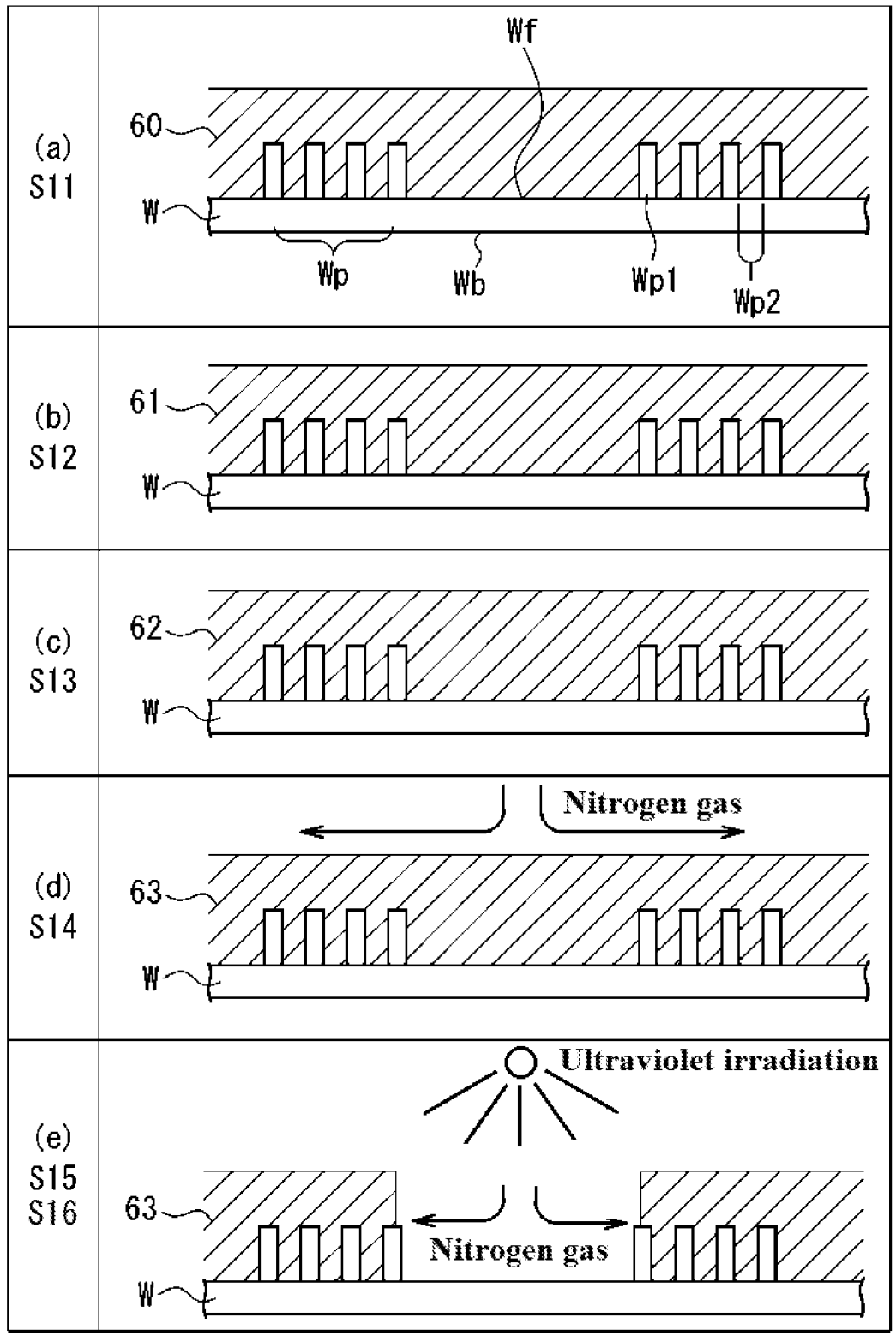
FIG. 7 is a diagram showing the state of the substrate in each step of the substrate treating method.

FIG. 6 is a flowchart showing the operation of the substrate treating apparatus 1 according to the first embodiment. FIG. 7 is a schematic view showing the state of the substrate W in individual steps of FIG. 6. On the substrate W, a concave/convex pattern Wp is formed in the preceding step. The pattern Wp includes convex portions Wp1 and concave portions Wp2. In the present embodiment, the height of the convex portion Wp1 falls within a range of 100 to 600 nm, and the width thereof falls within a range of 10 to 50 nm. The shortest distance between two adjacent convex portions Wp1 (the shortest width of the concave portions Wp2) falls within a range of 10 to 50 nm. The aspect ratio of the convex portion Wp1, that is, a value (height/width) obtained by dividing the height by the width falls within a range of 10 to 20.

The individual steps shown in FIGS. 7(a) to 7(e) are performed under the atmospheric pressure environment unless otherwise explicitly indicated. Here, the atmospheric pressure environment refers to an environment which is equal to or more than 0.7 atmospheres and equal to or less than 1.3 atmospheres with the standard atmospheric pressure (1 atmosphere, 1013 hPa) in the center. In particular, when the substrate treating apparatus 1 is arranged within a clean room having a positive pressure, the environment of the front surface Wf of the substrate W is higher than 1 atmosphere.

With reference back to FIG. 6, an operator first provides an instruction to perform a substrate processing program 19 corresponding to a predetermined substrate W. Thereafter, as a preparation for loading the substrate W into the substrate treating apparatus 1, the operation instruction is provided by the control unit 13, and thus the substrate treating apparatus 1 performs the following operation.

The rotation of the rotation driving part 52 is stopped, and the chuck pins 54 are located in positions suitable for receiving and delivering the substrate W. Then, the chuck pins 54 are brought into an opened state with an unillustrated opening/closing mechanism.

When the unprocessed substrate W is loaded into the substrate treating apparatus 1 with an unillustrated substrate loading/unloading mechanism and is placed on the chuck pins 54, the chuck pins 54 are brought into a closed state with the unillustrated opening/closing mechanism.

After the unprocessed substrate W is held by the substrate holding unit 51, a washing step S11 is performed on the substrate with an unillustrated wet washing unit. The washing step S11 includes rinse processing for supplying a washing liquid to the front surface Wf of the substrate W so as to perform washing and thereafter removing the washing liquid. The supply of the washing liquid (in the case of the rinse processing, a rinse liquid) is performed, by the operation instruction to the rotation driving part 52 provided by the control unit 13, on the front surface Wf of the substrate W which is rotated about the axis A1 at a constant speed. The washing liquid is not particularly limited, and for example, SC-1 (liquid containing ammonia, a hydrogen peroxide solution and water), SC-2 (liquid containing hydrochloric acid, a hydrogen peroxide solution and water) and the like can be mentioned. The rinse liquid is not particularly limited, and for example, the DIW and the like can be mentioned. The amounts of washing liquid and rinse liquid supplied are not particularly limited, and can be set as necessary according to the range which is washed and the like. The washing time is also not particularly limited, and can be set as necessary.

In the present embodiment, the wet washing unit is used, thus the SC-1 is supplied to the front surface Wf of the substrate W so as to wash the front surface Wf and thereafter the DIW is further supplied to the front surface Wf so as to remove the SC-1.

FIG. 7(a) shows a state of the substrate W when the washing step S11 is completed. As shown in FIG. 7(a), on the front surface Wf of the substrate W on which the pattern Wp is formed, the DIW (represented by "60" in the figure) supplied in the washing step S11 is adhered.

With reference back to FIG. 6, an IPA rinse step S12 of supplying the IPA to the front surface Wf of the substrate W on which the DIW 60 is adhered is performed. The control unit 13 first provides the operation instruction to the rotation driving part 52 such that the substrate W is rotated about the axis A1 at a constant speed.

Then, the control unit 13 provides the operation instruction to the revolvingly driving part 14 such that the nozzle 32 is located in the center portion of the front surface Wf of the substrate W. Then, the control unit 13 provides the operation instruction to the valve 36 such that the valve 36 is opened. In this way, the IPA is supplied from the IPA tank 37 through the pipe 35 and the nozzle 32 to the front surface Wf of the substrate W.

The IPA supplied to the front surface Wf of the substrate W is made to flow from around the center of the front surface Wf of the substrate W toward the peripheral portion of the substrate W by centrifugal force generated by the rotation of the substrate W so as to be diffused over the entire front surface Wf of the substrate W. In this way, the DIW adhered to the front surface Wf of the substrate W is removed by the supply of the IPA, and thus the entire front surface Wf of the substrate W is covered with the IPA. The rotation speed of the substrate W is preferably set such that the thickness of the film formed of the IPA is higher than the height of the convex portions Wp1 on the entire front surface Wf. The amount of IPA supplied is not particularly limited, and can be set as necessary.

After the completion of the IPA rinsing step S12, the control unit 13 provides the operation instruction to the valve 36 such that the valve 36 is closed. The control unit 13 also provides the operation instruction to the revolvingly driving part 14 such that the nozzle 32 is located in the retraction position P2.

FIG. 7(b) shows a state of the substrate W when the IPA rinse step S12 is completed. As shown in FIG. 7(b), on the front surface Wf of the substrate W on which the pattern Wp is formed, the IPA (represented by "61" in the figure) supplied in the IPA rinse step S12 is adhered, and the DIW 60 is replaced by the IPA 61 so as to be removed from the front surface Wf of the substrate W.

With reference back to FIG. 6, a process liquid supply step (supply step) S13 of supplying the process liquid that contains, as the dry auxiliary liquid, the dry auxiliary substance in a molten state to the front surface Wf of the substrate W to which the IPA 61 is adhered. The control unit 13 first provides the operation instruction to the rotation driving part 52 such that the substrate W is rotated about the axis A1 at a constant speed. Here, the rotation speed of the substrate W is preferably set such that the thickness of the liquid film formed of the dry auxiliary liquid is higher than the height of the convex portions Wp1 on the entire front surface Wf.

Then, the control unit 13 provides the operation instruction to the revolvingly driving part 14 such that the nozzle 22 is located in the center portion of the front surface Wf of the substrate W. The control unit 13 then provides the operation instruction to the valve 26 such that the valve 26 is opened. In this way, the process liquid is supplied from the process liquid storing tank 271 through the pipe 25 and the nozzle 22 to the front surface Wf of the substrate W.

The temperature of the dry auxiliary liquid supplied is set within a range equal to or more than the melting point of the dry auxiliary substance and below the boiling point thereof at least after the dry auxiliary liquid is supplied to the front surface Wf of the substrate W. For example, when as the dry auxiliary substance, 1,1,2,2,3,3,4-heptafluorocyclopentane (having a boiling point of 82.5° C.) represented by a chemical structure below is used, the temperature is preferably set within a range equal to or more than 35° C. and equal to or less than 82° C. The amount of dry auxiliary liquid supplied is not particularly limited, and can be set as necessary.

[Chemical Formula 3]

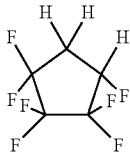

As described above, the dry auxiliary liquid which is made to have a high temperature equal to or more than the melting point is supplied, and thus after the film of the dry auxiliary liquid is formed on the front surface Wf of the substrate W, a solidified body can be formed. Consequently, the solidified body whose layer thickness is uniform and which is formed in the shape of a film can be obtained, and thus it is possible to reduce the occurrence of dry unevenness. In a case where the temperature of the substrate W and an ambient temperature within the chamber 11 are equal to or less than the melting point of the dry auxiliary substance, when the dry auxiliary liquid whose temperature slightly exceeds the melting point is supplied to the substrate W, the dry auxiliary liquid may be solidified within a very short period of time after contact with the substrate W. In such as case, it is impossible to form the solidified body whose layer thickness is uniform, and thus it is difficult to reduce dry unevenness. Hence, when the temperature of the substrate W and the ambient temperature within the chamber 11 are equal to or less than the melting point of the dry auxiliary substance, temperature adjustment is preferably performed such that the temperature of the dry auxiliary liquid is sufficiently higher than the melting point.

The dry auxiliary liquid supplied to the front surface Wf of the substrate W is made to flow from around the center of the front surface Wf of the substrate W toward the circumferential portion of the substrate W by centrifugal force generated by the rotation of the substrate W so as to be diffused over the entire front surface Wf of the substrate W. In this way, the IPA adhered to the front surface Wf of the substrate W is removed by the supply of the dry auxiliary liquid such that the entire front surface Wf of the substrate W is covered with the dry auxiliary liquid. When the process liquid supply step S13 is completed, the control unit 13 provides the operation instruction to the valve 26 such that the valve 26 is closed. The control unit 13 also provides the operation instruction to the revolvingly driving part 14 such that the nozzle 22 is located in the retraction position P1.

FIG. 7(c) shows a state of the substrate W when the process liquid supply step S13 is completed. As shown in FIG. 7(c), on the front surface Wf of the substrate W on which the pattern Wp is formed, the dry auxiliary liquid (represented by "62" in the figure) supplied in the process liquid supply step S13 is adhered, and the IPA 61 is replaced by the dry auxiliary liquid 62 so as to be removed from the front surface Wf of the substrate W.

With reference back to FIG. 6, a solidification step S14 of solidifying the dry auxiliary liquid 62 supplied to the front surface Wf of the substrate W so as to form a solidified film of the dry auxiliary substance is then performed. The control unit 13 first provides the operation instruction to the rotation driving part 52 such that the substrate W is rotated about the axis A1 at a constant speed. Here, the rotation speed of the substrate W is set such that the dry auxiliary liquid 62 can form a predetermined film thickness higher than the convex portions Wp1 on the entire front surface Wf.

Then, the control unit 13 provides the operation instruction to the revolvingly driving part 14 such that the nozzle 42 is located in the center portion of the front surface Wf of the substrate W. Then, the control unit 13 provides the operation instruction to the valve 46 such that the valve 46 is opened. In this way, the gas (in the present embodiment, the nitrogen gas which is cooled to the freezing point or less) is supplied from the gas tank 47 through the pipe 45 and the nozzle 42 toward the front surface Wf of the substrate W.

The nitrogen gas supplied to the front surface Wf of the substrate W is made to flow from around the center of the front surface Wf of the substrate W toward the circumferential portion of the substrate W by centrifugal force generated by the rotation of the substrate W so as to be diffused over the entire front surface Wf of the substrate W which is covered with the dry auxiliary liquid 62. In this way, the film of the dry auxiliary liquid 62 formed on the front surface Wf of the substrate W is cooled to a low temperature of the freezing point of the dry auxiliary substance or less so as to be solidified, and thus the solidified body is formed.

FIG. 7(d) shows a state of the substrate W when the solidification step S14 is completed. As shown in 7(d), the dry auxiliary liquid 62 supplied in the process liquid supply step S13 is cooled by the supply of the nitrogen gas which is cooled to the freezing point or less so as to be solidified, and thus the solidified body (represented by "63" in the figure) containing the dry auxiliary substance is formed.

With reference back to FIG. 6, a sublimation step S15 is then performed which sublimes the solidified body 63 formed on the front surface Wf of the substrate W so as to remove it from the front surface Wf of the substrate W. Even in the sublimation step S15, the supply of the gas (nitrogen gas) from the nozzle 42 is continued from the solidification step S14.

Here, the partial pressure of the vapor of the dry auxiliary substance in the nitrogen gas is set lower than the saturated vapor pressure of the dry auxiliary substance at a temperature when the nitrogen gas is supplied. Hence, the nitrogen gas described above is supplied to the front surface Wf of the substrate W so as to make contact with the solidified body 63, and thus the dry auxiliary substance is sublimed from the solidified body 63 into the nitrogen gas. Since the nitrogen gas has a temperature lower than the melting point of the dry auxiliary substance, it is possible to sublime the solidified body 63 while preventing the melting of the solidified body 63.

In this way, the dry auxiliary substance in a solid state is sublimed, and thus when the substances such as the IPA present on the front surface Wf of the substrate W are removed, it is possible to satisfactorily dry the front surface Wf of the substrate W while the surface tension is prevented from acting on the pattern Wp so as to reduce the occurrence of a pattern collapse.

In the present embodiment, in the solidification step S14 and the sublimation step S15, the common gas supplying unit 41 is used so as to supply the nitrogen gas which is an inert gas to the dry auxiliary substance at a temperature of the freezing point of the dry auxiliary substance or less. In this way, immediately after the solidification step S14, the sublimation step S15 can be started, and thus it is possible to reduce the processing time caused by the operations of the individual portions of the substrate treating apparatus 1 and the amount of memory of the substrate processing program 19 in the control unit 13 which is operated. Since the number of components used in the processing can be decreased, it is possible to reduce the cost of the device. In particular, in the present embodiment, the pressure reducing unit 71 is not used, and thus the pressure reducing unit 71 can be omitted.

The sublimation step S15 can also be started during the solidification step S14. As described previously, the solidification of the film of the dry auxiliary liquid 62 develops from around the center of the front surface Wf of the substrate W toward the circumferential portion of the substrate W. Hence, in the solidified body 63, even during the solidification step S14, the sublimation step S15 can be performed on the part around the center of the front surface Wf of the substrate W which is formed in the initial stage of the solidification step S14. In this way, it is possible to reduce the processing time of the substrate.

With reference back to FIG. 6, in the sublimation step S15, an ultraviolet irradiation step (organic substance removal step) S16 is also performed which removes organic substances precipitated from the sublimation interface of the solidified body 63. The ultraviolet irradiation step S16 is preferably performed so as to overlap at least part of the sublimation step S15, and in the present embodiment, the ultraviolet irradiation step S16 is performed by directly irradiating ultraviolet rays from the ultraviolet lamp 82 to the sublimation interface of the solidified body 63. In this way, the organic substances included in the solidified body 63 can be decomposed so as to be removed when the organic substances are precipitated on the sublimation interface. Consequently, when the organic substances are brought into an aggregated state by interaction, it is possible to prevent the collapse of the pattern from occurring by action on the concave/convex pattern Wp.

Specifically, the control unit 13 provides the operation instruction to the lighting circuit 83 so as to turn on the ultraviolet lamp 82, and thus the ultraviolet irradiation step S16 is performed. Here, for the direction of irradiation of ultraviolet rays and the range of irradiation thereof, the control unit 13 also provides the operation instruction to the lighting circuit 83, and thus ultraviolet rays are irradiated to the sublimation interface of the solidified body 63. The sublimation of the solidified body 63 develops while being expanded concentrically from around the center of the front surface Wf of the substrate W toward the circumferential portion. Hence, the irradiation of ultraviolet rays is performed so as to follow the development of the sublimation of the solidified body 63, and thus control is preferably performed such that the irradiation of ultraviolet rays is prevented from being performed on the surface in which the solidified body 63 is already sublimed and from which thus the substrate W is exposed. In this way, it is possible to prevent the substrate W from being oxidized by the irradiation of ultraviolet rays so as to be damaged.

The organic substances included in the solidified body 63 are substances which are not sublimable under conditions in which at least the dry auxiliary substance of the solidified body 63 is sublimed. The organic substances include not only a substance which is originally included in the dry auxiliary liquid 62 but also an impurity which is inevitably mixed in an arbitrary step from the washing step S11 to the solidification step S14. The organic substances can include a substance which is not sublimable and which is added as necessary.

With respect to the conditions of the irradiation of ultraviolet rays, the wavelength range of ultraviolet rays irradiated from the ultraviolet lamp 82 is not particularly limited, and can be set within a range of several tens of nanometers to 400 nanometers as necessary. Although the accumulated amount of ultraviolet rays is not particularly limited, it preferably falls within a range of 10 mW/cm$^2$ to 10 W/cm$^2$ in terms of enhancing the efficiency of removal of the organic substances.

In the present embodiment, the ultraviolet irradiation step S16 is started when the sublimation step S15 is started, and is completed when the sublimation step S15 is completed. In this way, the organic substances which are precipitated during the sublimation step S15 can be decomposed so as to be removed without leakage, and the unnecessary irradiation of ultraviolet rays to the pattern-formed surface and the like of the substrate W can be reduced.

However, in the present invention, the time when the ultraviolet irradiation step S16 is started is not limited to the time in this embodiment. For example, the ultraviolet irradiation step S16 may be started before the start of the sublimation step S15 or may be started during the sublimation step S15. For example, when ultraviolet rays have a wavelength range of 185 nm or less, the ultraviolet rays themselves have strong chemical action and react with oxygen in air so as to generate ozone. Hence, the ultraviolet irradiation step S16 is started before the start of the sublimation step S15, the ultraviolet rays having the wavelength range described above are irradiated and thus it is possible to previously generate ozone. Consequently, the organic substances can also be removed by ozone decomposition (ozone oxidation). Furthermore, ultraviolet rays having a wavelength range of around 250 nm are also irradiated, and thus the ozone which is generated by the irradiation of the ultraviolet rays having the wavelength range of 185 nm or less can be decomposed into active oxygen, with the result that it is possible to further enhance the effect of removing the organic substances. When a certain amount of time is necessary until the output of the irradiation of ultraviolet rays by the ultraviolet lamp 82 is stable, the ultraviolet irradiation step S16 is previously started before the start of the sublimation step S15, and thus it is possible to produce a stable output when the organic substances are actually decomposed so as to be removed.

In the present invention, it is undesirable to start the ultraviolet irradiation step S16 after the completion of the sublimation step S15. After the completion of the sublimation step S15, the organic substances precipitated on the sublimation interface of the solidified body 63 are brought into the aggregated state, and thus the collapse of the pattern Wp occurs. Hence, even when the residue of the organic substances on the substrate W is removed after the collapse of the pattern Wp, the collapse of the pattern is not prevented, with the result that the effects of the present invention cannot be obtained.

In the present invention, the time when the ultraviolet irradiation step S16 is completed is also not limited to the time in this embodiment, and for example, the ultraviolet irradiation step S16 may be completed during the sublimation step S15. Alternatively, after the completion of the sublimation step S15, the ultraviolet irradiation step S16 may be completed. For example, when after the completion of the sublimation step S15, the ultraviolet irradiation step S16 is completed, the precipitated organic substances can be decomposed so as to be removed without leakage, and thus it is possible to further reduce the occurrence of the collapse of the pattern.

Since the sublimation step S15 is continuously performed, the ultraviolet irradiation step S16 is preferably continuously performed according to, for example, the degree of development of the sublimation step S15. In this way, it is possible to enhance the efficiency of the processing. However, in the present invention, the ultraviolet irradiation step S16 is not prevented from being intermittently performed as necessary.

FIG. 7(e) shows a state of the substrate W during the sublimation step S15 and the ultraviolet irradiation step S16. As shown in FIG. 7(e), the solidified body 63 of the dry auxiliary substance formed in the solidification step S14 is sublimed by, for example, the supply of the nitrogen gas so as to be removed from the front surface Wf. The organic substances precipitated on the sublimation interface of the solidified body 63 in the process of the sublimation of the solidified body 63 are also decomposed so as to be removed. In this way, the drying of the front surface Wf of the substrate W is completed.

After the completion of the sublimation step S15, the control unit 13 provides the operation instruction to the valve 46 such that the valve 46 is closed. The control unit 13 also provides the operation instruction to the revolvingly driving part 14 such that the nozzle 42 is located in the retraction position P3. After the completion of the ultraviolet irradiation step S16, the control unit 13 provides the operation instruction to the lighting circuit 83 such that the ultraviolet lamp 82 is turned off.

In this way, a series of substrate dry processing steps are completed. After the substrate dry processing as described above, the substrate W on which the dry processing has been performed is unloaded from the chamber 11 with the unillustrated substrate loading/unloading mechanism.

As described above, in the present embodiment, the dry auxiliary liquid including the dry auxiliary substance is supplied to the front surface Wf of the substrate W to which the IPA is adhered, the dry auxiliary liquid is solidified on the front surface Wf of the substrate W, the solidified body including the dry auxiliary substance is formed and thereafter the solidified body is sublimed so as to be removed from the front surface Wf of the substrate W, with the result that the dry processing on the substrate W is performed. Then, when the sublimable substance in the solidified body is sublimed, the organic substances precipitated on the sublimation interface are decomposed by the irradiation of ultraviolet rays so as to be removed, and thus it is possible to reduce the occurrence of the collapse of the pattern Wp caused by interaction between the organic substances.

Second Embodiment

A second embodiment according to the present invention will be described below. The present embodiment differs from the first embodiment in that instead of the irradiation of ultraviolet rays, the organic substance removal step is performed by the supply of ozone gas. In the configuration as described above, it is also possible to satisfactorily dry the front surface of the substrate while reducing the collapse of the pattern caused by the organic substances precipitated from the solidified body.

<2-1 Configuration of Substrate Treating Apparatus and Process Liquid>

Figure 8:
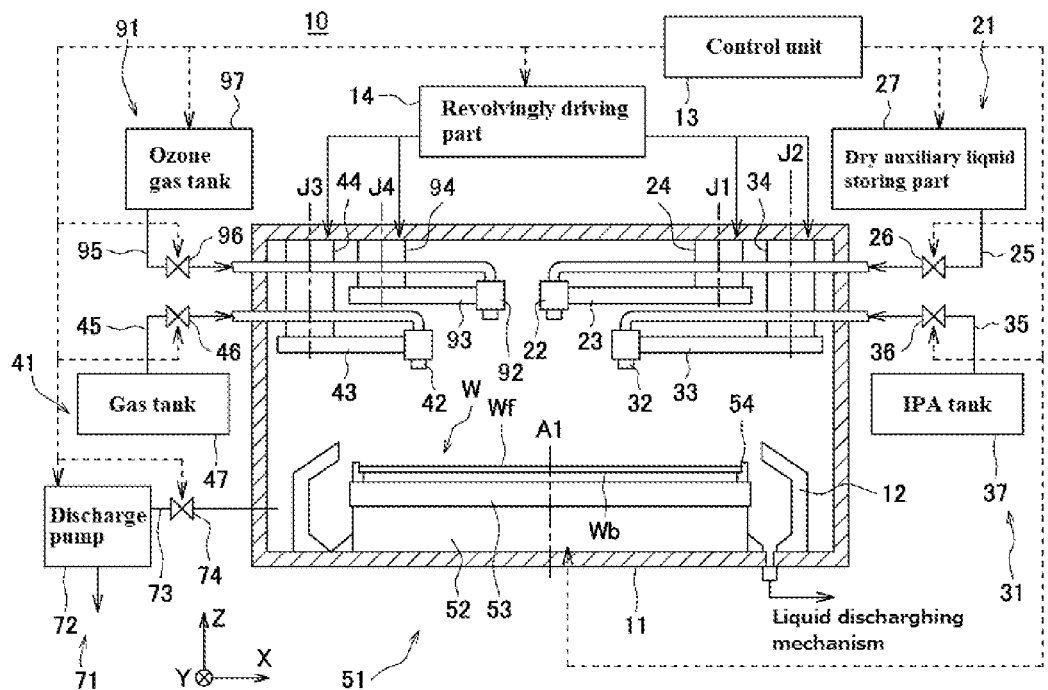
FIG. 8 is an illustrative diagram schematically showing a substrate treating apparatus according to a second embodiment of the present invention.
Figure 9:
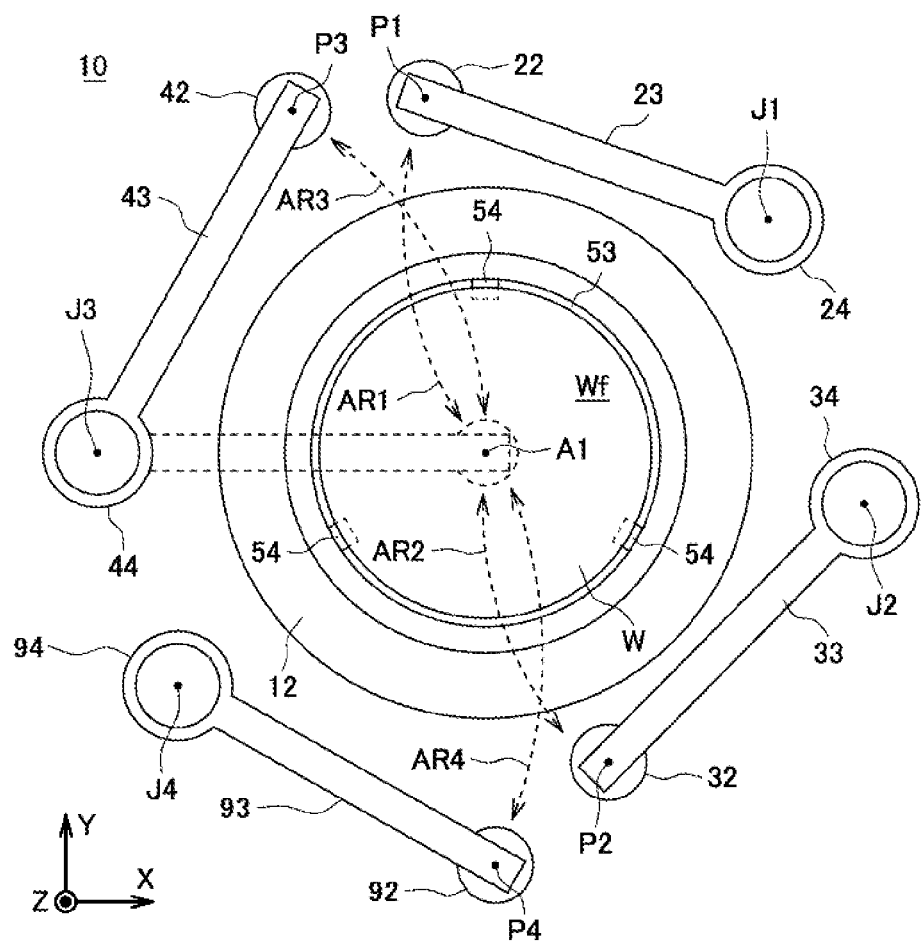
FIG. 9 is a schematic plan view showing the substrate treating apparatus.

A substrate treating apparatus according to the second embodiment will be described with reference to FIGS. 8 and 9 as necessary. FIG. 8 is an illustrative diagram schematically showing the substrate treating apparatus 10 according to the present embodiment. FIG. 9 is a schematic plan view showing an internal configuration of the substrate treating apparatus 10.

The substrate treating apparatus 10 according to the second embodiment basically has the same configuration as the substrate treating apparatus 1 according to the first embodiment (see FIG. 8) except that the substrate treating apparatus 10 includes an ozone gas supplying unit (organic substance removing unit) 91 instead of the ultraviolet irradiating unit 81. A control unit according to the second embodiment has the same configuration as the control unit 13 according to the first embodiment. Hence, those which have the same functions are identified with the same symbols, and the description thereof will be omitted.

The ozone gas supplying unit 91 is a unit which supplies an ozone gas to the pattern-formed surface of the substrate W, and includes, as shown in FIG. 8, a nozzle 92, an arm 93, a turning shaft 94, a pipe 95, a valve 96 and an ozone ($O_3$) gas tank 97.

The ozone gas tank 97 is connected through the pipe 95 with the pipeline to the nozzle 92, and the valve 96 is interposed partway through the path of the pipe 95. In the ozone gas tank 97, the ozone gas is stored, and the ozone gas within the ozone gas tank 97 is pressurized with an unillustrated pressurization unit so as to be fed from the pipe 95 toward the nozzle 92. Since the pressurization unit can be realized by pressurization with a pump or the like or by compressing and storing the gas into the ozone gas tank 97, any pressurization unit may be used. The supply source of the ozone gas may be utility facilities provided within a factory or the like.

The valve 96 is electrically connected to the control unit 13, and is normally closed. The opening and closing of the valve 96 is controlled by the operation instruction of the control unit 13. When the valve 96 is opened by the operation instruction of the control unit 13, the ozone gas is passed through the pipe 95 and is supplied from the nozzle 92 to the front surface Wf of the substrate W.

The nozzle 92 is attached to the tip end portion of the arm 93 which is provided so as to be extended horizontally, and is arranged above the spin base 53. The back end portion of the arm 93 is supported by the turning shaft 94 provided so as to be extended in the Z direction such that the back end portion of the arm 93 is freely rotated about an axis J4, and the turning shaft 94 is provided so as to be fixed within the chamber 11. The arm 93 is coupled through the turning shaft 94 to the revolvingly driving part 14. The revolvingly driving part 14 is electrically connected to the control unit 13, and turns the arm 93 about the axis J4 by the operation instruction from the control unit 13. As the arm 93 is turned, the nozzle 92 is also moved.

As indicated by solid lines in FIG. 9, the nozzle 92 is normally located outside the circumferential portion of the substrate W, and is arranged in a retraction position P4 outside the scattering prevention cup 12. When the arm 93 is turned by the operation instruction of the control unit 13, the nozzle 92 is moved along the path of an arrow AR4 so as to be arranged in a position above the center portion (the axis A1 or the vicinity thereof) of the front surface Wf of the substrate W.

In the substrate treating apparatus 10, an interruption mechanism may be provided which interrupt a certain space between the nozzle 92 and the substrate W from an atmosphere within the chamber 11. In this way, the ozone gas blown out from the nozzle 92 is scattered to the surrounding other than the substrate W, and thus it is possible to prevent the efficiency of removal of the organic substances precipitated on the sublimation interface from being lowered. As the interruption mechanism, for example, a form is mentioned in which an interruption plate or the like is provided in the nozzle 92.

In the substrate treating apparatus 10, an ozone gas discharge unit (unillustrated) for discharging the ozone gas may be provided. This allows the suction and discharge of the ozone gas supplied from the ozone gas supplying unit 91 to the sublimation interface of the solidified body 63. The configuration of the ozone gas discharge unit is not particularly limited, and an ozone gas discharge unit can be mentioned which includes at least an ozone gas exhaust pump, a discharge pipe, a valve and a suction nozzle. In this case, the ozone gas exhaust pump is connected through the discharge pipe with the pipeline to the suction nozzle, and is also electrically connected to the control unit 13. The drive of the ozone gas exhaust pump is controlled by the operation instruction of the control unit 13, and the ozone gas exhaust pump is normally brought into a stopped state. The valve is interposed in the discharge pipe. The valve is electrically connected to the control unit 13, and is normally closed. The opening and closing of the valve is controlled by the operation instruction of the control unit 13. The ozone gas discharge unit configured as described above can locally suck the ozone gas from the suction nozzle and discharge it, and thus it is possible to reduce significant variations in the condition of the pressure within the substrate treating apparatus 10 and the like.

Although in the present embodiment, the description is given using, as the example, the form in which the ozone gas supplying unit 91 is provided in the substrate treating apparatus 10, the present invention is not limited to this form. For example, the gas supplying unit 41 may be made to function as the ozone gas supplying unit. In this case, a unit configuration can be adopted in which the tank for storing the ozone gas is connected through another pipe with the pipeline to the nozzle 42 and in which furthermore, another valve is inserted partway through the path of the other pipe. Then, the other valve is opened and closed by the control unit 13, and thus it is possible to timely supply the ozone gas within the tank through the other pipe from the nozzle 42.

<2-2 Substrate Treating Method>

A substrate treating method using the substrate treating apparatus 10 according to the second embodiment will then be described.

The substrate treating method of the second embodiment differs from that of the first embodiment in that the substrate treating apparatus 10 is used and that as the organic substance removal step, instead of the ultraviolet irradiation step, an ozone gas supply step is performed.

Figure 10:
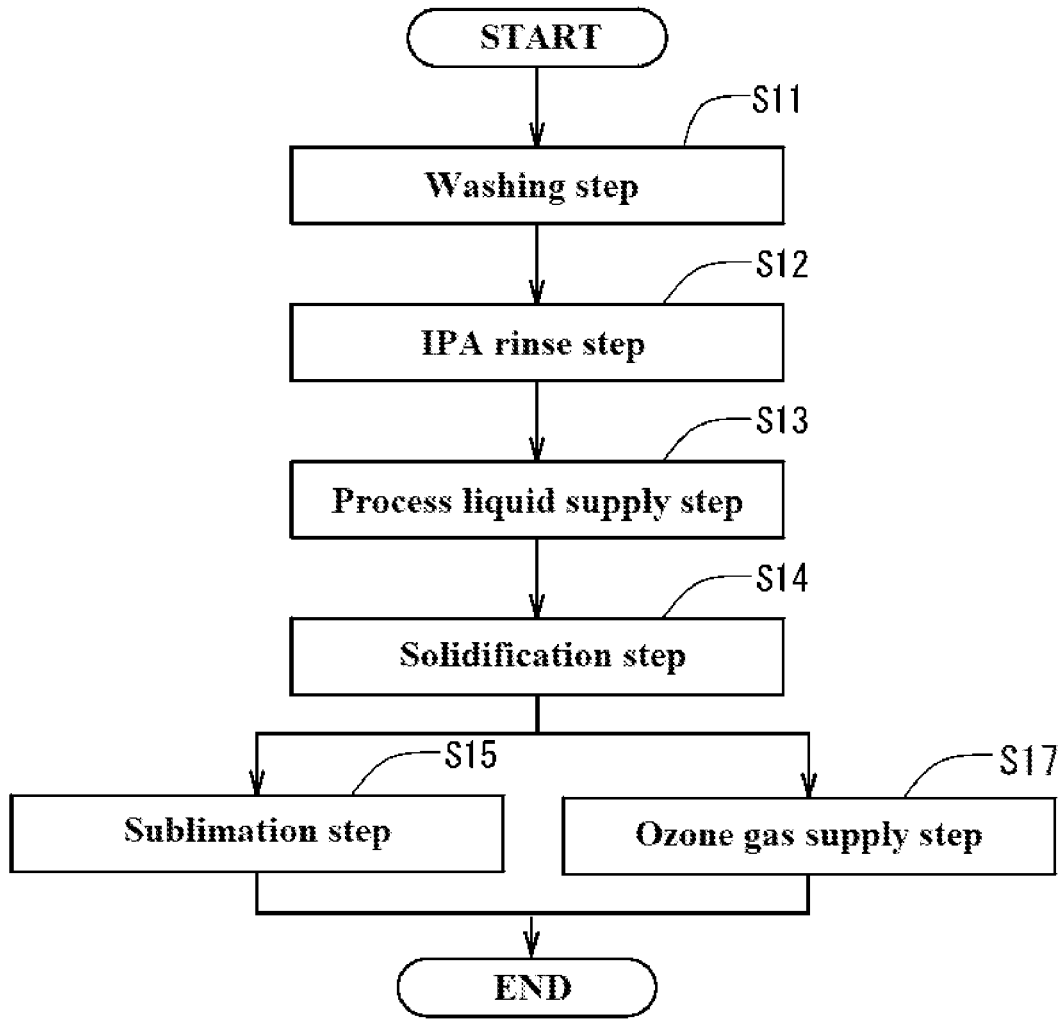
FIG. 10 is a flowchart showing a substrate treating method using the substrate treating apparatus.
Figure 11:
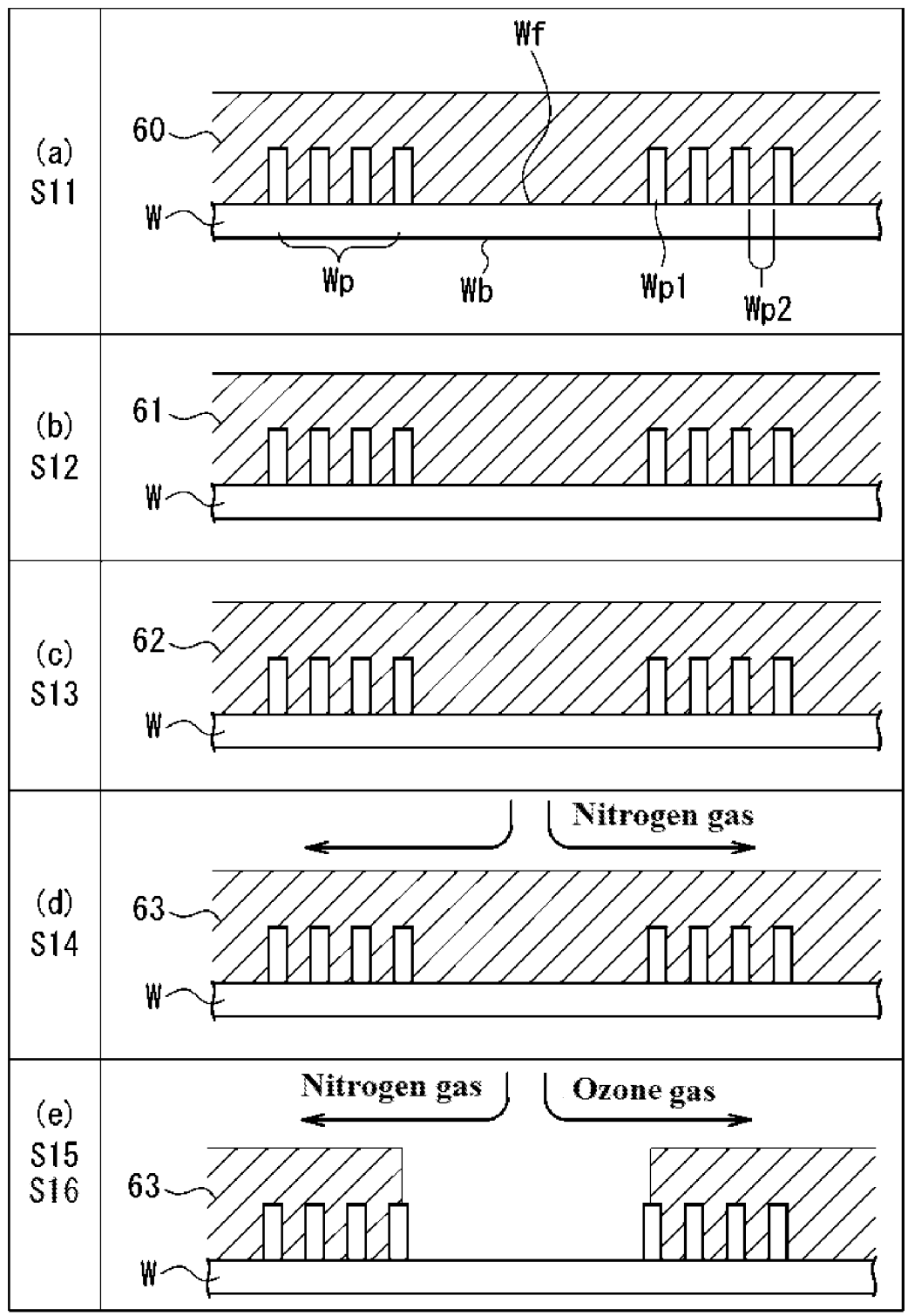
FIG. 11 is a diagram showing the state of the substrate in each step of the substrate treating method according to the second embodiment.

FIG. 10 is a flowchart showing the substrate treating method using the substrate treating apparatus 10. FIG. 11 is a schematic view showing the state of the substrate W in each step in the present embodiment.

In the second embodiment, the washing step S11, the IPA rinse step S12, the process liquid supply step S13, the solidification step S14 and the sublimation step S15 are individually the same as in the first embodiment. Hence, the description of parts corresponding to those in FIGS. 10 and 11 will be omitted.

The ozone gas supply step S17 is performed so as to overlap at least part of the sublimation step S15.

In the present embodiment, the ozone gas supplying unit 91 supplies the ozone gas to the sublimation interface of the solidified body 63 such that the ozone gas makes contact with the sublimation interface, and thus the ozone gas supply step S17 is performed. In this way, the organic substances precipitated on the sublimation interface of the solidified body 63 can be oxidized and dissolved so as to be removed. Thus, when the organic substances are brought into the aggregated state by interaction between the organic substances, gravity acts on the concave/convex pattern Wp, with the result that it is possible to prevent the occurrence of the collapse of the pattern.

Here, in order to sublime the solidified body 63, the nitrogen gas supplied toward around the center of the front surface Wf of the substrate W is made to flow toward the circumferential portion of the substrate W by centrifugal force generated by the rotation of the substrate W. Hence, the sublimation of the solidified body 63 is also started from around the center of the front surface Wf of the substrate W, and the region of the sublimation is concentrically extended toward the circumferential portion of the substrate W. Therefore, the supply of the ozone gas is preferably performed so as to follow the sublimation interface which is extended from around the center of the front surface Wf of the substrate W toward the circumferential portion.

An inert gas such as nitrogen gas may be contained in the ozone gas. Although the concentration of the ozone gas is not particularly limited, in terms of enhancing the efficiency of removal of the organic substances, the concentration of the ozone gas preferably falls within a range of 0.01 to 100% by volume with respect to the total volume, and more preferably falls within a range of 5 to 100% by volume. The concentration of the ozone gas is set equal to or more than 0.01% by volume, and thus the ability to decompose and remove the organic substances can be maintained, and the occurrence of the collapse of the pattern Wp can be reduced. On the other hand, the concentration of the ozone gas is set equal to or less than 100% by volume, and thus the front surface Wf of the substrate W is prevented from being oxidized so as to be damaged. Although the amount of ozone gas supplied is not particularly limited, in terms of enhancing the efficiency of removal of the organic substances, the amount preferably falls within a range of 10 to 300 L/min. The amount of ozone gas supplied is set equal to or more than 10 L/min, and thus the ability to decompose and remove the organic substances can be maintained, and the occurrence of the collapse of the pattern Wp can be reduced. On the other hand, when the amount of ozone gas supplied is about 300 L/min which is the upper limit, for example, in a case where an interruption plate or the like is used as the nozzle 92, the ozone gas can be sufficiently supplied on the substrate W without the atmosphere within the chamber 11 being mixed thereinto.

In the present embodiment, as in the ultraviolet irradiation step S16 of the first embodiment, the ozone gas supply step S17 is started when the sublimation step S15 is started, and is completed when the sublimation step S15 is completed. In this way, the organic substances which are precipitated during the sublimation step S15 can be decomposed so as to be removed without leakage.

The ozone gas supply step S17 may be started before the start of the sublimation step S15 or may be started during the step. However, it is undesirable to start the ozone gas supply step S17 after the completion of the sublimation step S15. As described in the first embodiment, after the completion of the sublimation step S15, the collapse of the pattern Wp already occurs, and even when the residue of the organic substances on the substrate W is removed after the collapse of the pattern Wp, the collapse of the pattern is not prevented, with the result that the effects of the present invention cannot be obtained.

The ozone gas supply step S17 may be completed during the sublimation step S15 or may be completed after the completion thereof. For example, when after the completion of the sublimation step S15, the ozone gas supply step S17 is completed, the precipitated organic substances can be decomposed so as to be removed without leakage, and thus it is possible to further reduce the occurrence of the collapse of the pattern.

Since the sublimation step S15 is continuously performed, the ozone gas supply step S17 is preferably continuously performed according to, for example, the degree of development of the sublimation step S15. In this way, it is possible to enhance the efficiency of the processing. However, in the present invention, the ozone gas supply step S17 is not prevented from being intermittently performed as necessary.

FIG. 11(e) shows a state of the substrate W during the sublimation step S15 and the ozone gas supply step S17. As shown in FIG. 11(e), the solidified body 63 of the dry auxiliary substance formed in the solidification step S14 is sublimed by, for example, the supply of the nitrogen gas so as to be removed from the front surface Wf. The organic substances precipitated on the sublimation interface of the solidified body 63 in the process of the sublimation of the solidified body 63 are also decomposed so as to be removed. In this way, the drying of the front surface Wf of the substrate W is completed.

After the completion of the sublimation step S15, the control unit 13 provides the operation instruction to the valve 46 such that the valve 46 is closed. The control unit 13 also provides the operation instruction to the revolvingly driving part 14 such that the nozzle 42 is located in the retraction position P3. After the completion of the ozone gas supply step S17, the control unit 13 provides the operation instruction to the valve 96 such that the valve 96 is closed. The control unit 13 also provides the operation instruction to the revolvingly driving part 14 such that the nozzle 92 is located in the retraction position P4.

In this way, a series of substrate dry processing steps in the present embodiment are completed. After the substrate dry processing as described above, the substrate W on which the dry processing has been performed is unloaded from the chamber 11 with the unillustrated substrate loading/unloading mechanism.

(Others)

In the above discussion, the preferred embodiments of the present invention are described. However, the present invention is not limited to these embodiments, and can be practiced in other various forms. The major ones of the other various forms will be illustrated below.

In the first and second embodiments, the case where as the organic substance removal step, the ultraviolet irradiation step S16 and the ozone gas supply step S17 are individually performed is described as an example. However, the present invention is not limited to these embodiments, and the ultraviolet irradiation step S16 and the ozone gas supply step S17 may be used together. In this case, the ultraviolet irradiation step S16 and the ozone gas supply step S17 are performed so as to overlap at least part of the solidification step S14. Specifically, for example, during the sublimation step S15, the ultraviolet irradiation step S16 and the ozone gas supply step S17 may be performed simultaneously. During the sublimation step S15, the ultraviolet irradiation step S16 and the ozone gas supply step S17 may be performed in an arbitrary order. As the substrate treating apparatus used in this form, for example, a substrate treating apparatus can be used in which the substrate treating apparatus 1 according to the first embodiment further includes the ozone gas supplying unit 91 that is a unit for supplying the ozone gas to the pattern-formed surface of the substrate W.

In the first and second embodiments, the case where as the solidifying unit and the subliming unit, the gas supplying unit 41 is used is described as an example. However, the present invention is not limited to these embodiments, and as the solidifying unit and the subliming unit, the pressure reducing unit 71 for reducing the pressure within the chamber 11 may be used.

In the solidification step S14 when the pressure reducing unit 71 is used as the solidifying unit, the control unit 13 provides the operation instruction to the exhaust pump 72 such that the drive of the exhaust pump 72 is started. Then, the control unit 13 provides the operation instruction to the valve 74 such that the valve 74 is opened. In this way, the gas within the chamber 11 is discharged through the pipe 73 to the outside of the chamber 11. The interior of the chamber 11 other than the pipe 73 is brought into an airtight state, and thus the internal environment of the chamber 11 is reduced in pressure from the atmospheric pressure. The pressure reduction is performed, for example, from the atmospheric pressure (about 1 atmosphere, about 1013 hPa) to about $1.7 \times 10^{-5}$ atmospheres (1.7 Pa). In the practice of the invention of the present application, there is no limitation to the pressure described above, and the pressure within the chamber 11 after being reduced may be set as necessary according to the pressure resistance and the like of the chamber 11 and the like.

When the interior of the chamber 11 is reduced in pressure, the dry auxiliary liquid 62 supplied to the front surface Wf of the substrate W is evaporated, and thus the dry auxiliary liquid 62 is cooled by its vaporization heat so as to be solidified.

When in the sublimation step S15, the pressure reducing unit 71 is used as the subliming unit, the pressure reduction processing within the chamber 11 which is performed with the pressure reducing unit 71 is continued from the solidification step S14. By the pressure reduction processing, the environment within the chamber 11 reaches a pressure which is lower than the saturated vapor pressure of the dry auxiliary substance. Hence, the pressure reduction environment as described above is maintained, and thus the dry auxiliary substance can be sublimed from the solidified body 63.

When the sublimable substance is sublimed from the solidified body 63 so as to be evaporated, heat is taken away from the solidified body as sublimation heat. Hence, the solidified body 63 is cooled. Thus, even under an environment of a temperature slightly higher than the melting point of the sublimable substance, the solidified body 63 can be maintained at a temperature lower than the melting point of the sublimable substance without being cooled separately. Consequently, while the sublimable substance is being prevented from being molten in the solidified body 63, the sublimable substance can be sublimed. Since it is not necessary to additionally provide a cooling mechanism, it is possible to reduce the device cost and the processing cost.

In the present invention, between the solidification step S14 and the sublimation step S15, a temperature rise step of raising the temperature of the solidified body 63 such that the solidified body 63 is not molten can also be performed. In this way, it is possible to increase the rate of the sublimation in the sublimation step S15, and thus the processing time can be reduced. When the temperature rise step is provided, it can be started from during any one of the organic substance removal step (the ultraviolet irradiation step S16 or the ozone gas supply step S17), the solidification step S14, the temperature rise step and the sublimation step S15. However, the organic substance removal step is completed during the sublimation step S15, at the time of completion thereof or after the completion thereof. The temperature of the solidified body 63 can be raised in the temperature rise step by heating the solidified body 63 with a heating unit such as a heater.

INDUSTRIAL APPLICABILITY

The present invention can be applied to dry technology for removing liquid adhered to the front surface of a substrate and substrate processing technology in general for processing the front surface of a substrate using the dry technology.

CITATION LIST 1, 10 substrate treating apparatus
11 chamber
12 scattering prevention cup
13 control unit
14 revolvingly driving part
15 computation processing part
17 memory
19 substrate processing program
20 oxygen gas concentration
21 process liquid supplying unit (supplying unit)
22 nozzle
23 arm
24 turning shaft
25 pipe
26 valve
27 process liquid storing part
31 IPA supplying unit
32 nozzle
33 arm
34 turning shaft
35 pipe
36 valve
37 IPA tank
41 gas supplying unit (solidifying unit, subliming unit)
42 nozzle
43 arm
44 turning shaft
45 pipe
46 valve
47 gas tank
51 substrate holding unit
52 rotation driving part
53 spin base
54 chuck pin
60 DIW
61 IPA
62 dry auxiliary liquid
63 solidified body
71 pressure reducing unit
72 exhaust pump
74 valve
81 ultraviolet irradiating unit (organic substance removing unit)
82 ultraviolet lamp
83 lighting circuit
91 ozone gas supplying unit (organic substance removing unit)
92 nozzle
93 arm
94 turning shaft
95 pipe
96 valve
97 ozone gas tank
271 process liquid storing tank
272 temperature adjusting part
273 pipe
274 pressurization part
275 nitrogen gas tank
276 pump
277 agitation part
278 agitation control part
279 rotation part
471 gas storing part
472 gas temperature adjusting part
A1, J1, J2, J3, J4 axis
AR1, AR2, AR3, AR4 arrow
P1, P2, P3, P4 retraction position
S11 washing step
S12 IPA rinse step
S13 process liquid supply step (supply step)
S14 solidification step
S15 sublimation step
S16 ultraviolet irradiation step (organic substance removing unit)
S17 ozone gas supply step (organic substance removing unit)
W substrate
Wf front surface (of substrate)
Wb back surface (of substrate)
Wp pattern (on front surface of substrate)
Wp1 convex portion (of pattern)
Wp2 concave portion (of pattern)

The invention claimed is:

1. A substrate treating method comprising:
a supply step of supplying a process liquid including a sublimable substance to a pattern-formed surface of a substrate;
a solidification step of solidifying the process liquid on the pattern-formed surface so as to form a solidified body;
a sublimation step of subliming the solidified body so as to remove the solidified body from the pattern-formed surface; and
an organic substance removal step of removing, when the solidified body is sublimed, organic substances before the organic substances become aggregated during the sublimation of the solidified body, the organic substances being precipitated on a sublimation interface of the solidified body and not being sublimable in the sublimation step,
wherein the organic substance removal step is performed so as to overlap at least part of the sublimation step, and
wherein the organic substance removal step comprises at least one of the following:
irradiating ultraviolet rays to the sublimation interface of the solidified body in the sublimation step; and
directing ozone gas into contact with the sublimation interface of the solidified body in the sublimation step.
2. The substrate treating method according to claim 1, wherein the organic substance removal step is started before start of the sublimation step, at a time of the start of the sublimation step or during the sublimation step.

3. The substrate treating method according to claim 1, wherein the organic substance removal step is completed during the sublimation step, at a time of completion of the sublimation step or after the completion of the sublimation step.

4. The substrate treating method according to claim 1, wherein the organic substance removal step is continuously performed.

5. The substrate treating method according to claim 1, wherein the sublimation step is started during the solidification step.

* * * * *